US012581819B2

(12) United States Patent

Ju et al.

(10) Patent No.:     US 12,581,819 B2
(45) Date of Patent:       Mar. 17, 2026

(54) DISPLAY PANEL AND METHOD FOR MANUFACTURING THE SAME

(71) Applicant: Samsung Display Co., LTD., Yongin-si (KR)

(72) Inventors: Jinho Ju, Yongin-si (KR); Minjeong Oh, Yongin-si (KR); Kijune Lee, Yongin-si (KR); Sungeun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 445 days.

(21) Appl. No.: 18/217,591

(22) Filed: Jul. 2, 2023

(65) Prior Publication Data

US 2024/0107833 A1      Mar. 28, 2024

(30) Foreign Application Priority Data

Sep. 28, 2022    (KR) ......................... 10-2022-0123564

(51) Int. Cl.
| | |
|---|---|
| *H10K 59/131* | (2023.01) |
| *H10K 59/12* | (2023.01) |
| *H10K 59/121* | (2023.01) |
| *H10K 102/00* | (2023.01) |

(52) U.S. Cl.
CPC ....... *H10K 59/131* (2023.02); *H10K 59/1201* (2023.02); *H10K 59/1213* (2023.02); *H10K 2102/311* (2023.02)

(58) Field of Classification Search
None
See application file for complete search history.

(56) References Cited

U.S. PATENT DOCUMENTS

2019/0278145 A1    9/2019  Tanaka et al.
2023/0008830 A1*   1/2023  Jang ...................... H10D 86/60

* cited by examiner

*Primary Examiner* — Kyoung Lee
(74) *Attorney, Agent, or Firm* — CANTOR COLBURN LLP

(57) ABSTRACT

A display panel includes: a base layer, a pixel circuit, insulating layers, an organic layer, a first signal line, and a light emitting element. The base layer includes a boundary area and a pixel area, and openings corresponding to the boundary area are defined in the insulating layers. The pixel circuit overlaps the pixel area in a plan view, and the light emitting element is disposed on a top of the insulating layers and electrically connected to the pixel circuit. The organic layer is placed to fill the opening. The first signal line does not overlap the boundary area and overlaps the pixel area in the plan view. The boundary area includes a first boundary part and a second boundary part spaced apart with the first signal line therebetween in the plan view.

20 Claims, 24 Drawing Sheets

DISPLAY PANEL AND METHOD FOR MANUFACTURING THE SAME

This application claims priority to Korean Patent Application No. 10-2022-0123564, filed on Sep. 28, 2022, and all the benefits accruing therefrom under 35 U.S.C. § 119, the content of which in its entirety is herein incorporated by reference.

BACKGROUND

The invention relates to a display panel including a boundary area and a manufacturing method thereof.

A display device includes a display panel, and the display panel includes a light emitting element and transistors for controlling an electrical signal applied to the light emitting element. In order to accurately control the degree of light emission of the light emitting element, the number of transistors electrically connected to one light emitting element is increasing, and the number of wires transmitting electrical signals to these transistors is also increasing. Accordingly, a method for improving manufacturing efficiency of a display panel and connection reliability of wires is desirable.

SUMMARY

The invention provides a display panel with improved impact resistance and reliability.

The invention also provides a method for manufacturing a display panel with improved manufacturing efficiency.

An embodiment of the invention provides a display panel including: a base layer including a boundary area and a pixel area; a pixel circuit overlapping the pixel area in a plan view; a plurality of insulating layers in which an opening corresponding to the boundary area is defined; an organic layer filling the opening; a first signal line, which does not overlap with the boundary area and overlaps with the pixel area in the plan view; and a light emitting element disposed on the insulating layers and electrically connected to the pixel circuit, where the boundary area includes a first boundary part and a second boundary part spaced apart with the first signal line therebetween in the plan view.

In an embodiment, the organic layer may include a first sub organic layer corresponding to the first boundary part and a second sub organic layer corresponding to the second boundary part.

In an embodiment, a thickness of the first sub organic layer and a thickness of the second sub organic layer may be the same.

In an embodiment, in the plan view, the first sub organic layer and the second sub organic layer may be spaced apart from each other.

In an embodiment, on a plane perpendicular to a thickness direction of the display panel, the first signal line may extend in a first direction, and the first boundary part and the second boundary part may be spaced apart from each other in a second direction crossing the first direction.

In an embodiment, the display panel may further include: a barrier layer disposed on the base layer, where an upper surface of the barrier layer may be exposed by the opening.

In an embodiment, the display panel may further include a protective pattern disposed on the first signal line and not overlapping with the organic layer in the plan view, where the protective pattern may include a metal material.

In an embodiment, the insulating layers may include a first insulating layer on which the first signal line is disposed and a second insulating layer disposed to cover the first signal line, where the second insulating layer may include a first insulating part overlapping the first signal line and a second insulating part not overlapping the first signal line in the plan view, and a thickness of the first insulating part may be less than a thickness of the second insulating part.

In an embodiment, a first opening may be defined in the second insulating layer between the first insulating part and the second insulating part, where the first opening may constitute a part of the opening.

In an embodiment, the first insulating part and the second insulating part may not overlap with the organic layer in the plan view.

In an embodiment, the display panel may further include: a second signal line, which does not overlap with the boundary area and overlaps with the pixel area in the plan view and is disposed on the second insulating layer. The insulating layers may further include a third insulating layer disposed on the second signal line and a fourth insulating layer disposed on the third insulating layer, the fourth insulating layer may include a third insulating part not overlapping the first signal line or the second signal line and a fourth insulating part overlapping the first signal line and the second signal line in the plan view, and a thickness of the third insulating part and a thickness of the fourth insulating part may be the same.

In an embodiment, the third insulating part and the fourth insulating part may not overlap with the organic layer in the plan view.

In an embodiment, a second opening may be defined in the fourth insulating layer between the third insulating part and the fourth insulating part, wherein the second opening may constitute a part of the opening.

In an embodiment, the pixel circuit may include: a first transistor including a first semiconductor pattern and a first gate; and a second transistor including a second semiconductor pattern disposed in a different layer from the first semiconductor pattern and a second gate disposed in a different layer from the first gate, wherein the first signal line may be disposed in the same layer as the first gate or the second gate.

In an embodiment, the first transistor may be a silicon transistor, and the second transistor may be an oxide transistor.

In an embodiment of the invention, a method for manufacturing a display panel includes: preparing a base layer; forming a first signal line on the base layer; forming a first insulating layer to cover the first signal line; forming a protective pattern in an area overlapping the first signal line on the first insulating layer; forming an opening that does not overlap the protective pattern and passes through the first insulating layer; and forming an organic layer filling the opening, wherein the base layer includes a boundary area and a pixel area, and the opening is formed to correspond to the boundary area.

In an embodiment, in the forming of the protective pattern, a metal material or photoresist may be provided.

In an embodiment, the method may further include: forming a first semiconductor pattern on the base layer; and forming a first gate on the first semiconductor pattern, wherein the forming of the first semiconductor pattern may be performed before the forming of the first signal line, wherein the first signal line and the first gate may be formed in the same operation.

In an embodiment, the method may further include forming a contact hole in contact with the first gate, wherein the contact hole and the opening may be formed in the same operation.

In an embodiment, the contact hole may pass through the first insulating layer.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIG. 10A is a cross-sectional view showing a portion corresponding to line II-IP of FIG. 9;

FIG. 10B is a cross-sectional view illustrating a portion of a display panel according to an embodiment;

DETAILED DESCRIPTION

Figure 1:
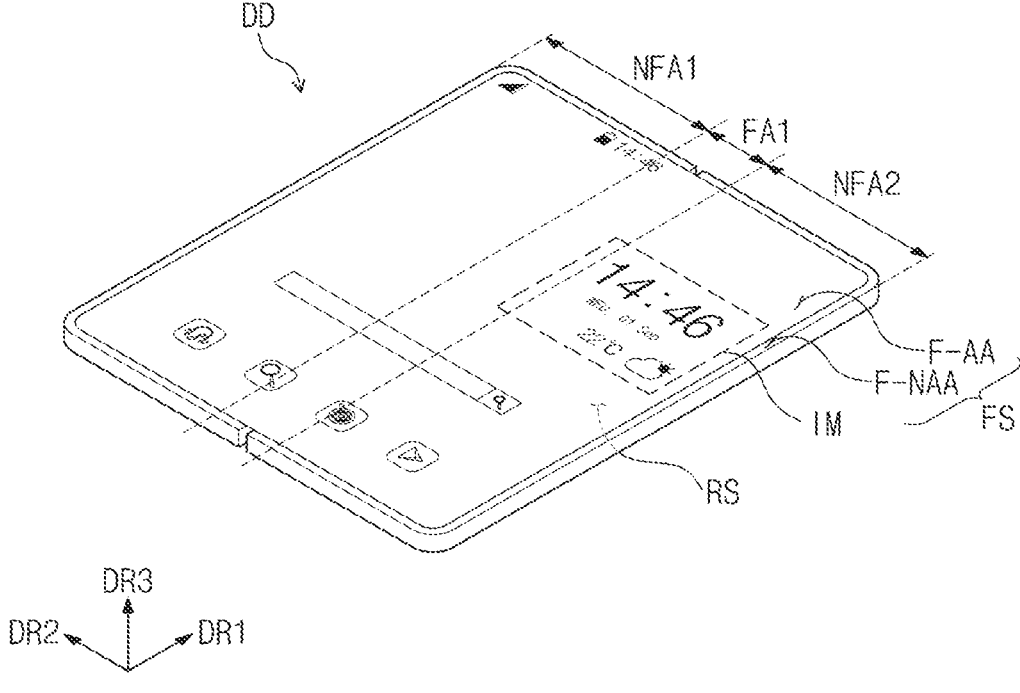
FIG. 1 is a perspective view illustrating a display device according to an embodiment.

Since the invention may have various changes and may have various forms, specific embodiments are illustrated in the drawings and described in detail in the text. However, this is not intended to limit the invention to specific embodiments, and should be understood to include all modifications, equivalents and substitutes included in the spirit and scope of the invention.

In this specification, when an element (or region, layer, part, etc.) is referred to as being "on", "connected to", or "coupled to" another element, it means that it may be directly placed on/connected to/coupled to other components, or a third component may be arranged between them.

Like reference numerals refer to like elements. Additionally, in the drawings, the thicknesses, proportions, and dimensions of components are exaggerated for effective description. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." "And/or" includes all of one or more combinations defined by related components.

It will be understood that the terms "first" and "second", etc. are used herein to describe various components but these components should not be limited by these terms. The above terms are used only to distinguish one component from another. For example, a first component may be referred to as a second component and vice versa without departing from the scope of the invention. The terms of a singular form may include plural forms unless otherwise specified.

In addition, terms such as "below", "the lower side", "on", and "the upper side" are used to describe a relationship of components shown in the drawing. The terms are described as a relative concept based on a direction shown in the drawing.

In various embodiments of the invention, the term "include," "comprise," "including," or "comprising," specifies a property, a region, a fixed number, a step, a process, an element and/or a component but does not exclude other properties, regions, fixed numbers, steps, processes, elements and/or components.

Unless otherwise defined, all terms (including technical and scientific terms) used herein have the same meaning as commonly understood by one of ordinary skill in the art to which this invention belongs. In addition, terms such as terms defined in commonly used dictionaries should be interpreted as having a meaning consistent with the meaning in the context of the related technology, and it should not be construed in an overly ideal or overly formal sense unless explicitly defined here.

Figure 2A:
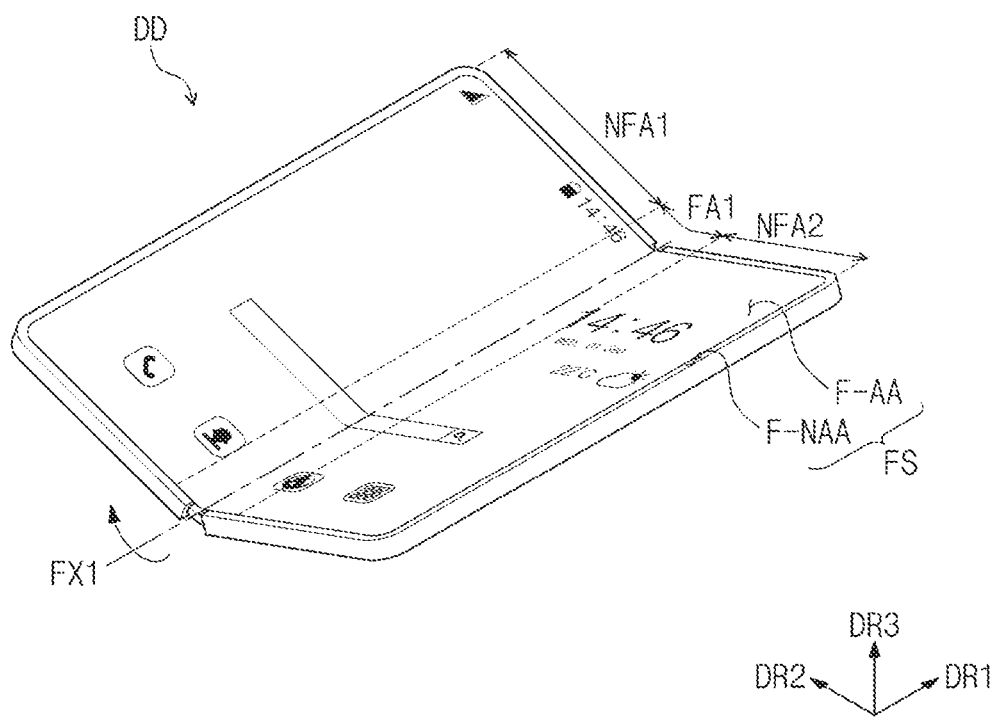
FIG. 2A is a perspective view illustrating a display device according to an embodiment.
Figure 2B:
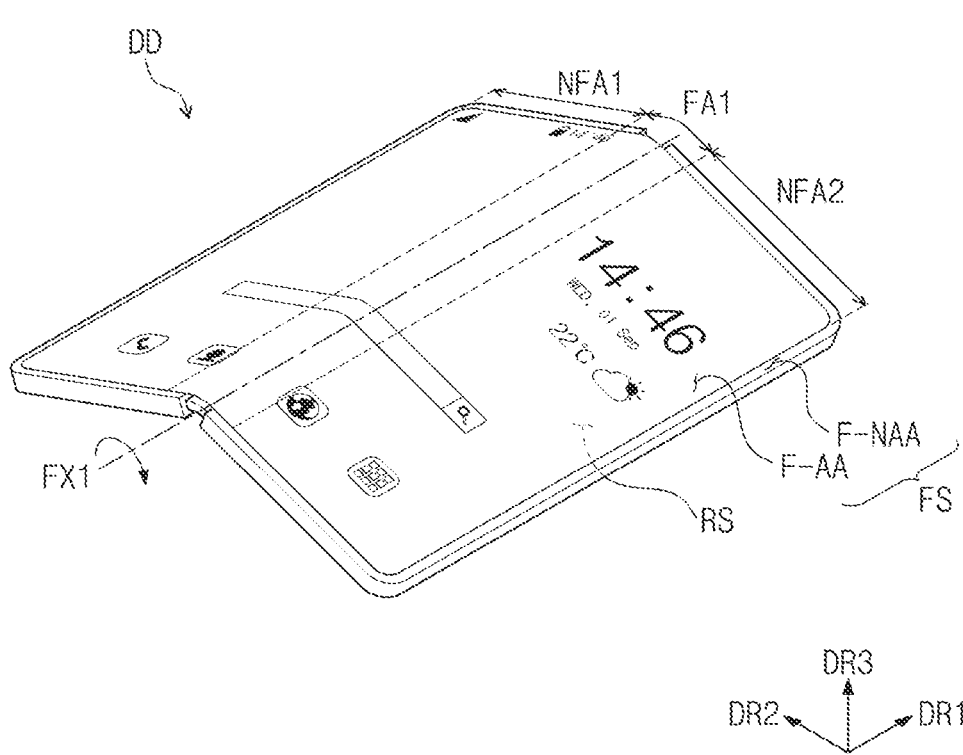
FIG. 2B is a perspective view illustrating a display device according to an embodiment.

Hereinafter, one embodiment of the invention will be described with reference to the drawings. FIG. 1 is a perspective view illustrating a display device according to an embodiment. FIG. 2A is a perspective view illustrating an inner-folding process of the display device shown in FIG. 1. FIG. 2B is a perspective view illustrating an out-folding process of the display device shown in FIG. 1.

A display device DD according to an embodiment may be a device activated according to an electrical signal. The display device DD may be a flexible device. For example, the display device DD may be a portable electronic device, a tablet, a car navigation system, a game machine, a personal computer, a notebook computer, or a wearable device, but is not limited thereto. FIG. 1 illustrates that the display device DD is a portable electronic device.

The display device DD may display the image IM through the display surface FS. The display surface FS may include an active area F-AA and a peripheral area F-NAA. The active area F-AA may be an area activated according to an electrical signal. The display device DD may display the image IM through the active area F-AA. In addition, various types of external inputs may be detected in the active area F-AA. The peripheral area F-NAA may be adjacent to the active area F-AA. The peripheral area F-NAA may surround the active area F-AA. Accordingly, the shape of the active area F-AA may be substantially defined by the peripheral area F-NAA. However, this is shown as an example and the peripheral area F-NAA may be disposed adjacent to only one side of the active area F-AA or may be omitted. The display surface FS may include a plane defined by the first direction axis DR1 and the second direction axis DR2.

The rear surface RS of the display device DD may be a surface facing the display surface FS. For example, the rear surface RS is an outer surface of the display device DD, and pictures or images may not be displayed. Alternatively, the rear surface RS may function as a second display surface on which pictures or images are displayed.

In the present specification, the first direction axis DR1 and the second direction axis DR2 may be orthogonal to each other, and the third direction axis DR3 may be a direction normal to a plane defined by the first direction axis DR1 and the second direction axis DR2. A thickness direction of the display device DD may be parallel to the third direction axis DR3. An upper surface (or upper side) and a lower surface (or lower side) may be defined based on the third direction axis DR3. The upper surface (or upper side) refers to a surface (or direction) adjacent to the display surface FS, and the lower surface (or lower side) refers to a surface (or direction) adjacent to the rear surface RS. A "cross section" means a surface parallel to the thickness direction DR3, and the plane means a surface perpendicular to the thickness direction DR3. The plane means a plane defined by the first direction axis DR1 and the second direction axis DR2. In the "plan view" is a view in the thickness direction (i.e., the third direction DR3).

The directions indicated by the first to third direction axes DR1, DR2, and DR3 described herein are relative concepts and may be converted into other directions. Also, directions indicated by the first to third direction axes DR1, DR2, and DR3 may be described as the first to third directions, and the same reference numerals may be used.

The display device DD may include a folding area FA1 and non-folding areas NFA1 and NFA2. The display device DD may include a plurality of non-folding areas NFA1 and NFA2. The display device DD may include a first non-folding area NFA1 and a second non-folding area NFA2 spaced apart from each other with the folding area FA1 therebetween.

FIGS. 1 to 2B illustrate the display device DD including one folding area FA1, but this is exemplary, and a plurality of folding areas may be defined in the display device DD. In addition, the display device DD may be folded based on a plurality of folding axes so that a portion of the display surface FS faces each other, and the number of folding axes and the corresponding number of non-folding areas are not limited to one embodiment.

Referring to FIGS. 2A and 2B, the display device DD may be folded based on the first folding axis FX1. The first folding axis FX1 shown in FIGS. 2A and 2B is an imaginary axis extending in the first direction DR1, and the first folding axis FX1 may be parallel to the long side of the display device DD. However, this is exemplary, and the extension direction of the first folding axis FX1 is not limited to the first direction DR1.

The first folding axis FX1 may extend along the first direction axis DR1 on the display surface FS or may extend along the first direction axis DR1 below the rear surface RS. Referring to FIG. 2A, the first non-folding area NFA1 and the second non-folding area NFA2 face each other, and the display device DD may be in-folded such that the display surface FS is not exposed to the outside. Referring to FIG. 2B, the display device DD is folded based on the first folding axis FX1 such that it may be transformed into an out-folding state in which one area overlapping the first non-folding area NFA1 and the other area overlapping the second non-folding area NFA2 of the rear surface RS face each other.

Figure 3:
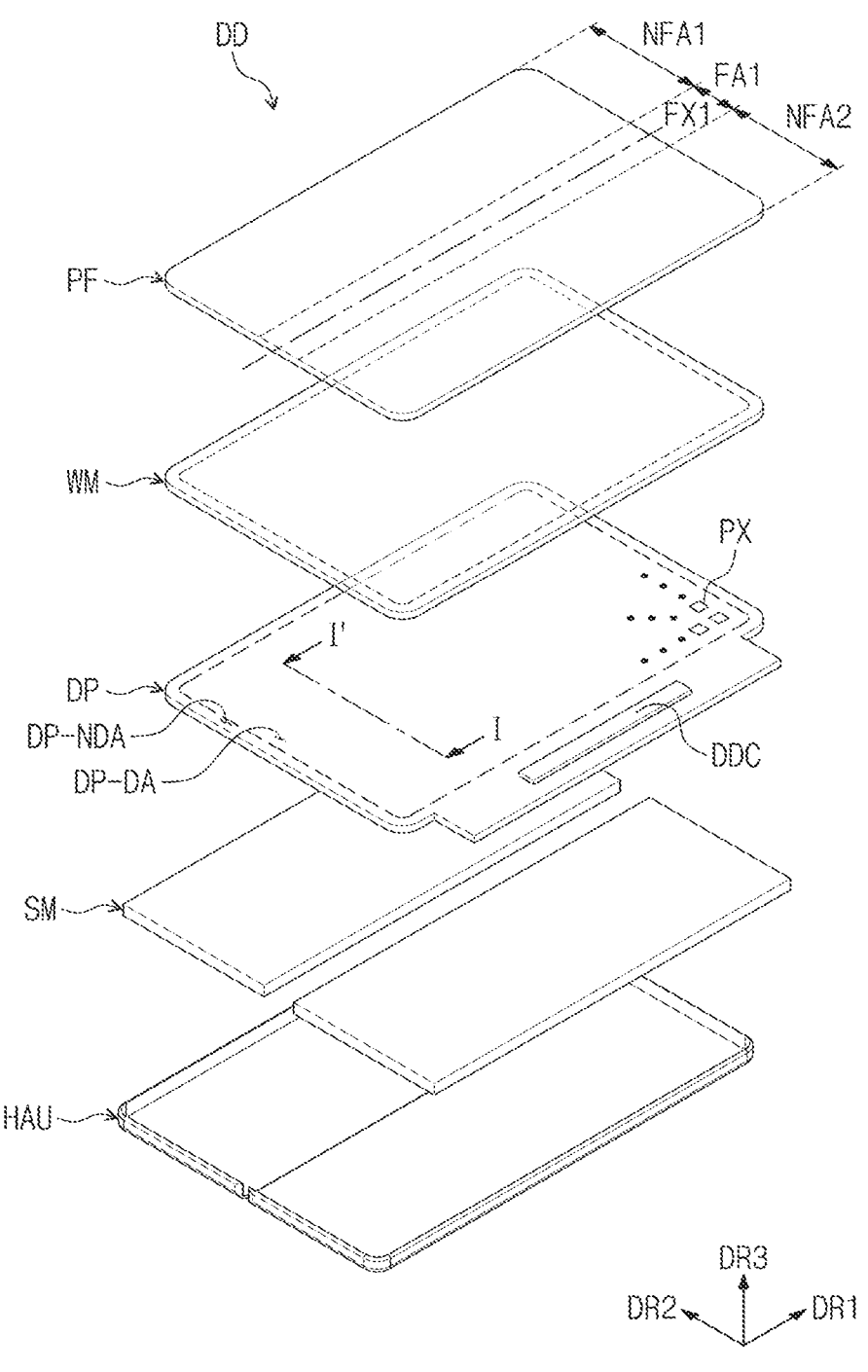
FIG. 3 is an exploded perspective view illustrating a display device according to an embodiment.

FIG. 3 is an exploded perspective view of a display device DD according to an embodiment. Referring to FIG. 3, the display device DD may include a display panel DP and a window WM disposed above the display panel DP. In addition, the display device DD may include a support member SM disposed below the display panel DP, a protective layer PF disposed above the window WM, and a housing HAU accommodating the display panel DP and the support member SM.

The protective layer PF may be a functional layer that protects the lower surface of the window WM. The protective layer PF may include an anti-fingerprint coating agent, a hard coating agent, an antistatic agent, and the like. Although not shown, an adhesive layer may be disposed between the window WM and the protective layer PF. The adhesive layer may include a conventional adhesive, and is not limited to any one embodiment.

The window WM may include a glass substrate. The window WM may protect the display panel DP or the like. The image IM (see FIG. 1) generated by the display panel DP may pass through the window WM and be provided to the user. For example, the window WM may include ultra thin glass ("UTG").

The support member ("SM") may include a metal material or a polymer material. For example, the support member SM may be formed of or include stainless steel, aluminum, or an alloy thereof. Alternatively, the support member SM may be formed of or include carbon fiber reinforced plastic ("CFRP") or the like. However, the embodiment is not limited thereto, and the support member SM may include a non-metallic material, plastic, glass fiber reinforced plastic, or glass in another embodiment.

Although not shown, the display device DD may further include a cushion layer, a shielding layer, and the like disposed below the support member SM. The cushion layer may include a sponge, foam, or an elastomer such as a urethane resin. The shielding layer may be an electromagnetic wave shielding layer or a heat dissipating layer.

The display panel DP may be a light emitting display panel. For example, the display panel DP may be an organic light emitting display panel, an inorganic light emitting display panel, a micro LED display panel, or a nano LED display panel. The display panel DP may include a display area DP-DA and a non-display area DP-NDA. The non-display area DP-NDA is adjacent to the display area DP-DA and may surround at least a portion of the display area DP-DA. The pixel PX may be disposed in the display area DP-DA, and the pixel PX may not be disposed in the non-display area DP-NDA. A data driving circuit DDC may be disposed on one side of the non-display area DP-NDA.

Although not shown, the display device DD may further include an input detection layer disposed directly on the upper side of the display panel DP. The input detection layer may detect at least one of the position of an externally applied touch and the intensity (pressure) of the touch. The input detection layer may have various structures or be composed of various materials, and is not limited to any one embodiment.

Figure 4:
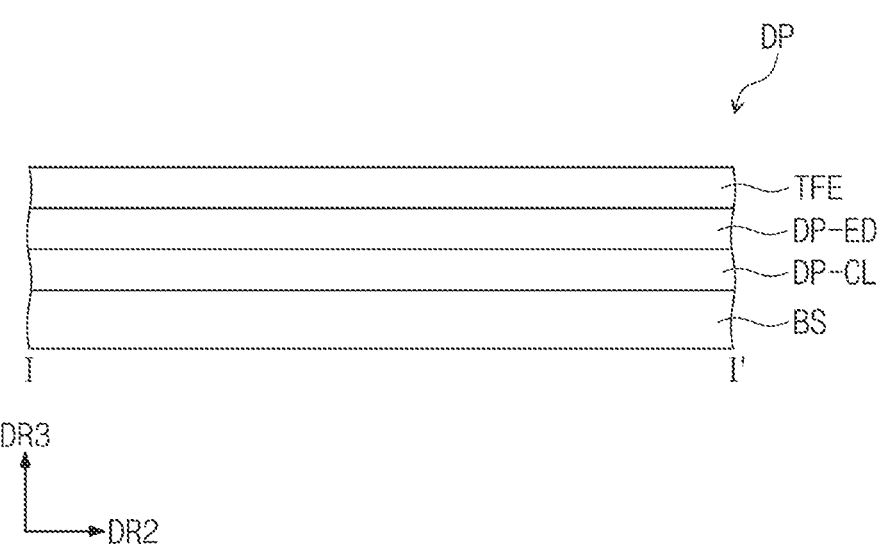
FIG. 4 is a cross-sectional view showing a portion corresponding to the line II' of FIG. 3.

FIG. 4 is a cross-sectional view showing a portion corresponding to the line of FIG. 3. FIG. 4 may be a cross-sectional view illustrating a display panel DP according to an embodiment. Referring to FIG. 4, the display panel DP according to an embodiment may include a base layer BS, a circuit layer DP-CL, a light emitting element layer DP-ED, and an encapsulation layer TFE, which are sequentially stacked. Unlike the illustration, a functional layer may be further disposed between two adjacent layers of the base layer BS, the circuit layer DP-CL, the light emitting element layer DP-ED, and the encapsulation layer TFE.

The base layer BS may provide a base surface on which the circuit layer DP-CL is disposed. The base layer BS may be a flexible substrate capable of being bent, folded, or rolled. The base layer BS may be a glass substrate, a metal substrate, or a polymer substrate. However, the embodiment is not limited thereto, and the base layer BS may include an inorganic layer, an organic layer, or a composite material layer in another embodiment.

The base layer BS may include a single layer or multiple layers. For example, the base layer BS may include a first synthetic resin layer, a multi- or single-layer inorganic layer, and a second synthetic resin layer disposed on the multi- or single-layer inorganic layer. Each of the first synthetic resin layer and the second synthetic resin layer may include a polyimide-based resin. In addition, each of the first synthetic resin layer and the second synthetic resin layer may include at least one of acrylic resin, methacrylate resin, polyisoprene resin, vinyl resin, epoxy resin, urethane resin, cellulose resin, siloxane resin, polyamide resin, and perylene resin. In the present specification "~"-based resin means to include a functional group of "~".

The circuit layer DP-CL may be disposed on the upper side of the base layer BS. The circuit layer DP-CL may include an insulating layer, a semiconductor pattern, a conductive pattern, and a signal line. The light emitting element layer DP-ED may be disposed on the upper side of the circuit layer DP-CL. The light emitting element layer DP-ED may include a light emitting element LD (see FIGS. 8A and 8B). For example, the light emitting element LD (see FIGS. 8A and 8B) may include an organic light emitting material, an inorganic light emitting material, an organic-inorganic light emitting material, a quantum dot, a quantum rod, a micro LED, or a nano LED.

The encapsulation layer TFE may be disposed on the light emitting element layer DP-ED. The encapsulation layer TFE may protect the light emitting element layer DP-ED from foreign substances such as moisture, oxygen, and dust particles. The encapsulation layer TFE may include at least one inorganic layer. The encapsulation layer TFE may include a structure in which an inorganic layer, an organic layer, and an inorganic layer are sequentially stacked.

Figure 5:
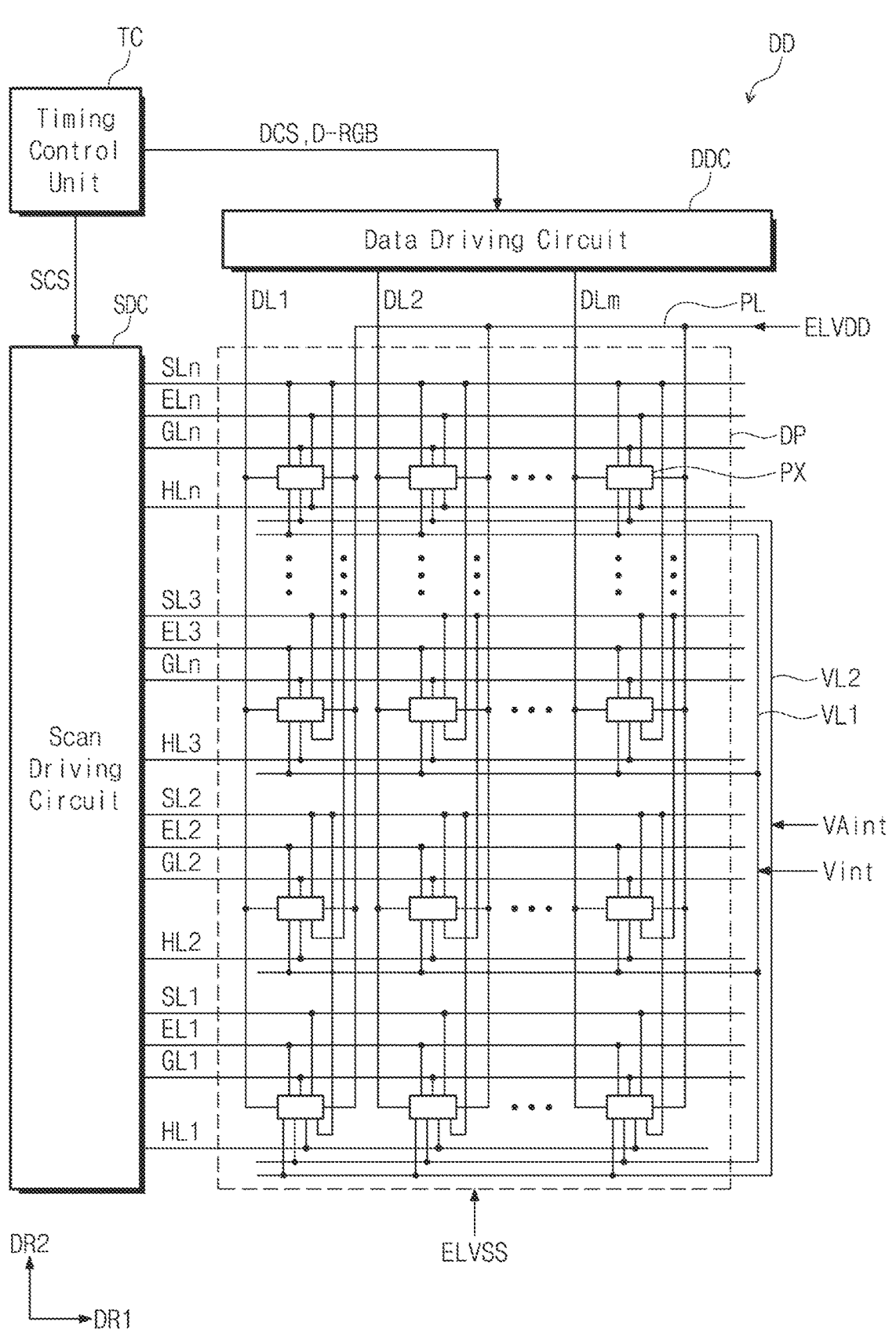
FIG. 5 is a block diagram of a display device according to an embodiment.
Figure 6:
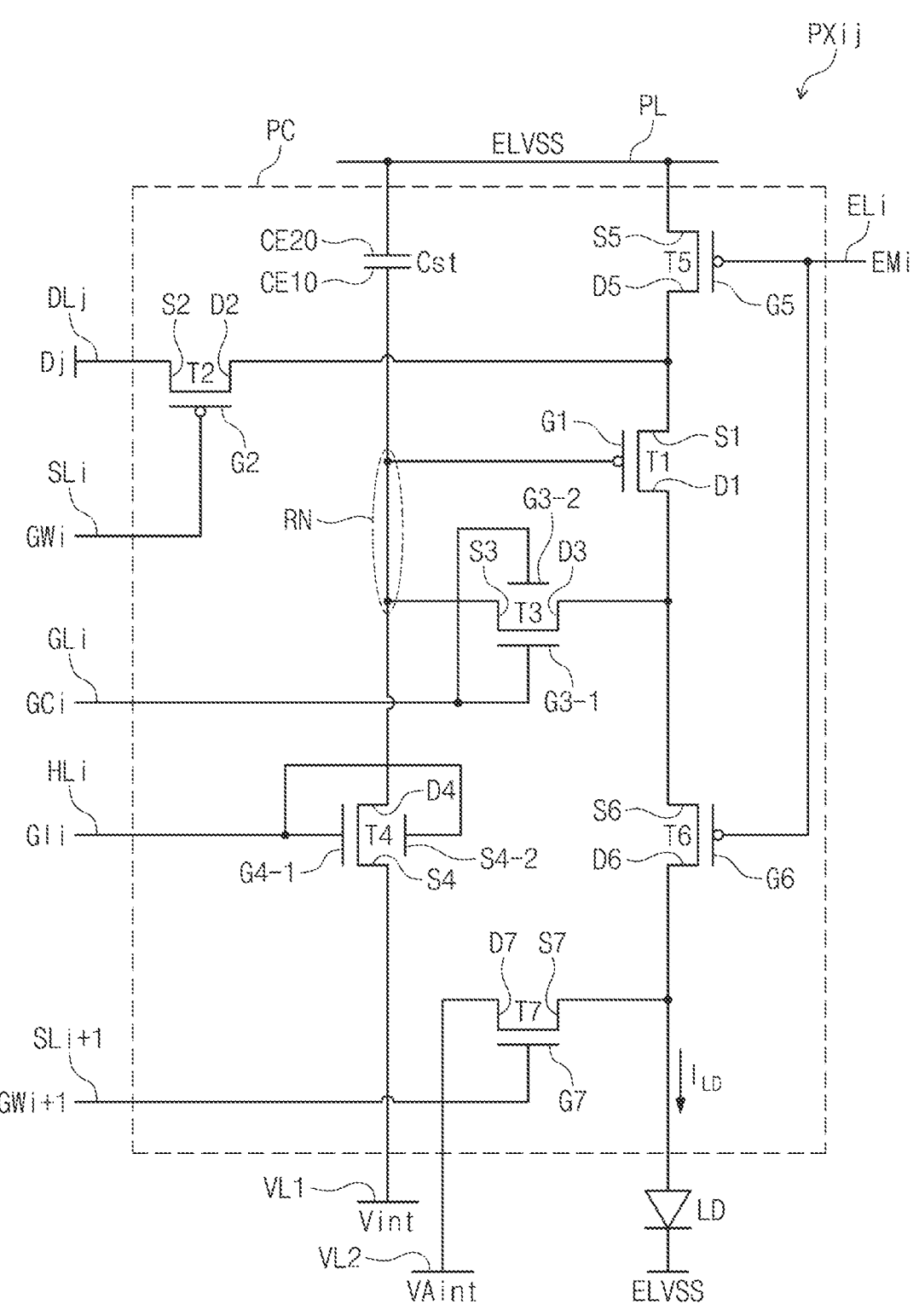
FIG. 6 is an equivalent circuit diagram of a pixel according to an embodiment.

FIG. 5 is a block diagram of a display device DD according to an embodiment. FIG. 6 is an equivalent circuit diagram of a pixel PX according to an embodiment.

Referring to FIG. 5, the display device DD may include a display panel DP, a timing control unit TC, a scan driving circuit SDC, and a data driving circuit DDC. At least one of the timing control unit TC, the scan driving circuit SDC, and the data driving circuit DDC may be provided in the form of a driving chip or may be directly formed on the display panel DP.

The timing control unit TC may receive the input image signals, convert the data format of the input image signals to meet the interface specification with the scan driving circuit SDC, and generate the image data D-RGB. The timing control unit TC may output image data D-RGB and various control signals DCS and SCS.

The scan driving circuit SDC may receive the scan control signal SCS from the timing control unit TC. The scan control signal SCS may include a vertical start signal for starting the operation of the scan driving circuit SDC, a clock signal for determining output timing of the signals, and the like. The scan driving circuit SDC may generate a plurality of scan signals and sequentially output the scan signals to the corresponding signal lines SL1 to SLn, GL1 to GLn, and HL1 to HLn. Also, the scan driving circuit SDC may generate a plurality of emission control signals in response to the scan control signal SCS and output the emission control signals to the corresponding emission lines EL1 to ELn.

The data driving circuit DDC receives the data control signal DCS and image data D-RGB from the timing control unit TC. The data driving circuit DDC may convert the image data D-RGB into data signals and output the data signals to a plurality of data lines DL1 to DLm to be described later. The data signals may be analog voltages corresponding to grayscale values of the image data D-RGB.

The plurality of groups of signal lines may include a first group of scan lines SL1 to SLn, a second group of scan lines GL1 to GLn, a third group of scan lines HL1 to HLn, emission lines EL1 to ELn, data lines DL1 to DLm, a first voltage line PL, a second voltage line VL1, and a third voltage line VL2. The first group of scan lines SL1 to SLn, the second group of scan lines GL1 to GLn, the third group of scan lines HL1 to HLn, and the emission lines EL1 to ELn may extend in the first direction DR1 and may be arranged in a second direction DR2 crossing the first direction DR1. The plurality of data lines DL1 to DLm may insulatively cross the first group of scan lines SL1 to SLn, the second group of scan lines GL1 to GLn, the third group of scan lines HL1 to HLn, and the emission lines EL1 to ELn.

Each of the first voltage line PL, the second voltage line VL1, and the third voltage line VL2 may include at least one of a component extending in the first direction DR1 and a component extending in the second direction DR2. Each of the first voltage line PL, the second voltage line VL1, and the third voltage line VL2 may include a component extending in the first direction DR1 and a component extending in the second direction DR2. The structure and shape of the first voltage line PL, the second voltage line VL1, and the third voltage line VL2 may be designed independently of each other.

Each of the plurality of pixels PX may be electrically connected to corresponding signal lines among the aforementioned signal lines. A connection relationship between the pixels PX and the signal lines may be changed according to the configuration of the driving circuit of the pixels PX.

The first voltage line PL may receive the first power voltage ELVDD. A second power voltage ELVSS may be applied to the display panel DP. The second power voltage ELVSS may have a lower level than the first power voltage ELVDD.

The second voltage line VL1 may receive the first initialization voltage Vint. The first initialization voltage Vint may have a level lower than the first power voltage ELVDD.

The third voltage line VL2 may receive the second initialization voltage VAint. The second initialization voltage VAint may have a lower level than the first power voltage ELVDD. The first initialization voltage Vint and the second initialization voltage VAint may be bias voltages having a constant level. The first initialization voltage Vint and the second initialization voltage VAint may have different levels. The second initialization voltage VAint may have a lower voltage than the first initialization voltage Vint.

The plurality of pixels PX may include a plurality of groups generating light of different colors. For example, the plurality of pixels PX may include red pixels generating red light, green pixels generating green light, and blue pixels generating blue light. The light emitting element of the red pixel, the light emitting element of the green pixel, and the light emitting element of the blue pixel may include light emitting layers formed of different materials.

FIG. 6 illustrates a pixel PXij connected to the i-th scan line SLi of the first group among the scan lines SL1 to SLn of the first group, and connected to the j-th data line DLj among the plurality of data lines DL1 to DLm. The pixel PXij may include a pixel driving circuit PC (hereinafter, a pixel circuit) and a light emitting element.

Referring to FIG. 6, the pixel circuit PC may include first to seventh transistors T1, T2, T3, T4, T5, T6, and T7 and a capacitor Cst. The first transistor T1, the second transistor T2, and the fifth to seventh transistors T5, T6, and T7 may be P-type transistors, and the third transistor T3 and the fourth transistor T4 may be N-type transistors. However, the invention is not limited thereto, and the first to seventh transistors T1, T2, T3, T4, T5, T6, and T7 may be implemented as either a P-type transistor or an N-type transistor.

Hereinafter, the input area (or input electrode) of the N-type transistor is described as a drain (or drain area), the input area of a P-type transistor is described as a source (or source area), the output area (or output electrode) of an N-type transistor is described as a source (or source area), and the output area of a P-type transistor is described as a drain (or drain area). Meanwhile, unlike illustrated, at least one of the first to seventh transistors T1, T2, T3, T4, T5, T6, and T7 may be omitted in another embodiment.

For example, the first transistor T1, the second transistor T2, and the fifth to seventh transistors T5, T6, and T7 may be silicon transistors. The third transistor T3 and the fourth transistor T4 may be oxide transistors.

The first transistor T1 may be a driving transistor, and the second transistor T2 may be a switching transistor. The capacitor Cst may be electrically connected between the first voltage line PL receiving the first power voltage ELVDD and the reference node RN. The capacitor Cst may include a first electrode CE10 electrically connected to the reference node RN and a second electrode CE20 electrically connected to the first voltage line PL.

The first transistor T1 may be electrically connected between the first voltage line PL and one electrode (e.g., an anode) of the light emitting element LD. The source S1 of the first transistor T1 may be electrically connected to the first voltage line PL. As used herein, "electrically connected between a transistor and a signal line or a transistor and a transistor" means "a transistor in which the source, drain, and gate have an integral shape with the signal line or are connected through a connection electrode". Another transistor may be disposed or omitted between the source S1 of the first transistor T1 and the first voltage line PL.

The drain D1 of the first transistor T1 may be electrically connected to the anode of the light emitting element LD. Another transistor may be disposed or omitted between the drain D1 of the first transistor T1 and the anode of the light emitting element LD. The gate G1 of the first transistor T1 may be electrically connected to the reference node RN.

The second transistor T2 may be electrically connected between the j-th data line DLj and the source S1 of the first transistor T1. The source S2 of the second transistor T2 may be electrically connected to the j-th data line DLj, and the drain D2 of the second transistor T2 may be electrically connected to the source S1 of the first transistor T1. The gate G2 of the second transistor T2 may be electrically connected to the i-th scan line SLi of the first group.

The third transistor T3 may be electrically connected between the reference node RN and the drain D1 of the first transistor T1. The drain D3 of the third transistor T3 may be electrically connected to the drain D1 of the first transistor T1, and the source S3 of the third transistor T3 may be electrically connected to the reference node RN. The gates G3-1 and G3-2 of the third transistor T3 may be electrically connected to the i-th scan line GLi of the second group.

The fourth transistor T4 may be electrically connected between the reference node RN and the second voltage line VL1. The drain D4 of the fourth transistor T4 may be electrically connected to the reference node RN, and the source S4 of the fourth transistor T4 may be electrically connected to the second voltage line VL1. The gates G4-1 and G4-2 of the fourth transistor T4 may be electrically connected to the i-th scan line HLi of the third group.

In FIG. 6, the third transistor T3 and the fourth transistor T4 are illustrated as including a plurality of gates, but the embodiment is not limited thereto. For another example, at least one of the third transistor T3 and the fourth transistor T4 may include only one gate.

The fifth transistor T5 may be electrically connected between the first voltage line PL and the source S1 of the first transistor T1. The source S5 of the fifth transistor T5 may be electrically connected to the first voltage line PL, and the drain D5 of the fifth transistor T5 may be electrically connected to the source S1 of the first transistor T1. The gate G5 of the fifth transistor T5 may be electrically connected to the i-th emission line ELi.

The sixth transistor T6 may be electrically connected between the drain D1 of the first transistor T1 and the light emitting element LD. The source S6 of the sixth transistor T6 may be electrically connected to the drain D1 of the first transistor T1, and the drain D6 of the sixth transistor T6 may be electrically connected to the anode of the light emitting element LD. The gate G6 of the sixth transistor T6 may be electrically connected to the i-th emission line ELi. Alternatively, the gate G6 of the sixth transistor T6 may be connected to a signal line different from the gate G5 of the fifth transistor T5.

The seventh transistor T7 may be electrically connected between the drain D6 of the sixth transistor T6 and the third voltage line VL2. The source S7 of the seventh transistor T7 may be electrically connected to the drain D6 of the sixth transistor T6, and the drain D7 of the seventh transistor T7 is electrically connected to the third voltage line VL2. The gate G7 of the seventh transistor T7 may be electrically connected to the (i+1)-th scan line SLi+1 of the first group.

Each of signals EMi, GIi, GWi, GCi, and GWi+1 may have a high level during a partial period and may have a low level during a partial period. The N-type transistors may be turned on when corresponding signals have a high level, and the P-type transistors may be turned on when corresponding signals have a low level.

When the emission control signal EMi has a high level, the fifth transistor T5 and the sixth transistor T6 may be turned off. When the fifth transistor T5 and the sixth transistor T6 are turned off, a current path may not be formed between the first voltage line PL and the light emitting element LD. Accordingly, the corresponding period may be defined as a non-emission period.

When the scan signal GIi applied to the i$^{th}$ scan line HLi of the third group has a high level, the fourth transistor T4 may be turned on. When the fourth transistor T4 is turned on, the reference node RN may be initialized by the first initialization voltage Vint. When the scan signal GWi applied to the i$^{th}$ scan line SLi of the first group has a low level and the scan signal GCi applied to the i$^{th}$ scan line GLi of the second group has a high level, the second transistor T2 and the third transistor T3 may be turned on.

Because the reference node RN is initialized to the first initialization voltage Vint, the first transistor T1 may be in a turned-on state. When the first transistor T1 is turned on, a voltage corresponding to a data signal Dj (FIG. 3B) may be provided to the reference node RN. At this time, the capacitor Cst may store the voltage corresponding to the data signal Dj. The voltage corresponding to the data signal Dj may be a voltage reduced by a threshold voltage Vth of the first transistor T1 from the data signal Dj.

When the scan signal GWi+1 applied to the (i+1)$^{th}$ scan line SLi+1 of the first group has a low, the seventh transistor T7 may be turned on. As the seventh transistor T7 is turned on, the anode of the light emitting element LD may be initialized to the second initialization voltage VAint. A parasitic capacitor of the light emitting element LD may be discharged.

When the emission control signal EMi has a low level, the fifth transistor T5 and the sixth transistor T6 may be turned on. When the fifth transistor T5 is turned on, the first power voltage ELVDD may be provided to the first transistor T1. When the sixth transistor T6 is turned on, the first transistor T1 and the light emitting element LD may be electrically connected. The light emitting element LD may generate light having a luminance corresponding to the amount of current provided.

Figure 7A:
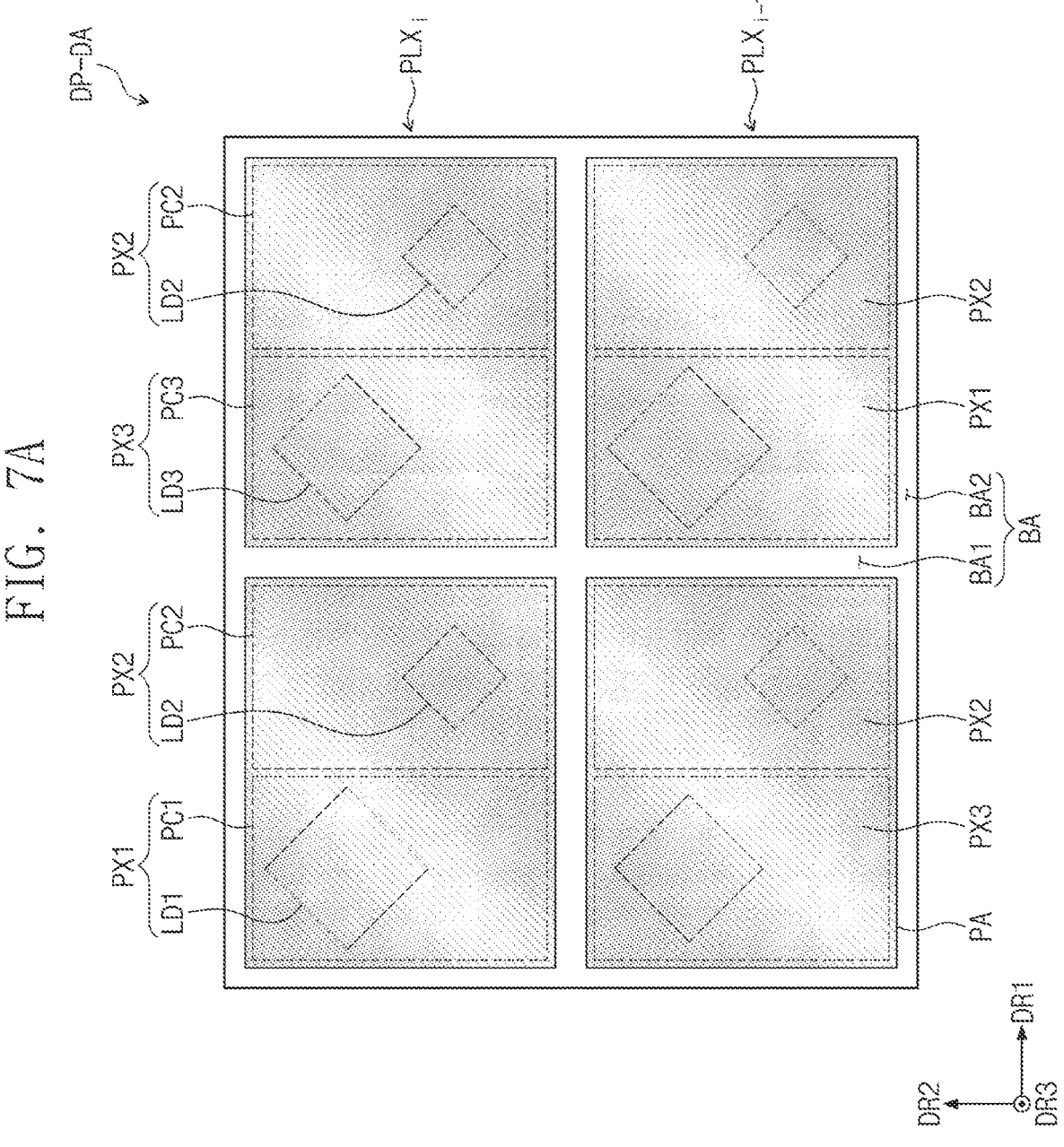
FIG. 7A is a plan view illustrating a display panel according to an embodiment.

FIG. 7A is an enlarged plan view of a display panel DP according to an embodiment, and more specifically, an enlarged view of a display area DP-DA of the display panel DP.

In FIG. 7A, two pixel rows PLXi and PLXi−1 are enlarged and illustrated. The i-th pixel row PLXi may include first color pixels PX1, second color pixels PX2, third color pixels PX3, and second color pixels PX2 arranged in the first direction DR1. Also, in the i-th pixel row PLXi, the first color pixels PX1, the second color pixels PX2, the third color pixels PX3, and the second color pixels PX2 may be repeatedly disposed along the first direction DR1 in this order.

The (i−1)-th pixel row PLXi−1 may include a third color pixel PX3, a second color pixel PX2, a first color pixel PX1, and a second color pixel PX2 arranged in the first direction DR1. In the (i−1)-th pixel row PLXi−1, the third color pixel PX3, the second color pixel PX2, the first color pixel PX1, and the second color pixel PX2 may be repeatedly disposed along the first direction DR1 in this order. Also, the color pixels of the pixel rows PLXi and PLXi−1 shown in FIG. 7A may be repeatedly disposed along the second direction DR2. In FIG. 7A, anodes of the first light emitting element LD1, the second light emitting element LD2, and the third light emitting element LD3 are indicated by dotted lines. FIG. 7A shows that two light emitting elements are disposed in one pixel area PA.

The display area DP-DA may include a plurality of pixel areas PA and a boundary area BA between the plurality of pixel areas PA. The boundary area BA may be disposed adjacent to at least a portion of each of the plurality of pixel areas PA. Two adjacent color pixels among the first color pixel PX1, the second color pixel PX2, and the third color pixel PX3 may be surrounded by the boundary area BA. The boundary area BA may include a second boundary area BA2 extending in the first direction DR1 and a first boundary area BA1 extending in the second direction DR2.

The pixel circuits PC1, PC2, and PC3 of the first color pixel PX1, the second color pixel PX2, and the third color pixel PX3 may be respectively disposed in the plurality of pixel areas PA. The pixel circuits PC1, PC2, and PC3 may overlap the pixel areas PA. Each of the pixel circuits PC1, PC2, and PC3 may be the same as the pixel circuit PC described with reference to FIG. 6. In FIG. 7A, each of the pixel circuits PC1, PC2, and PC3 is illustrated as substantially coincident with the pixel area PA, but the embodiment is not limited thereto. In this specification, "overlapping" is not limited to the same shape and the same area on a plane, but also includes cases having different shapes and/or different areas.

The pixel area PA is not a boundary area BA within the display area DP-DA of the display panel DP and may be defined as an area in which the first to seventh transistors T1, T2, T3, T4, T5, T6, and T7 are disposed. The boundary area BA is an area defined by an opening BA-OP (see FIGS. 8A and 8B) described later, and a display area DP-DA of the display panel DP that does not overlap with the opening BA-OP in a plan view may correspond to the pixel area PA.

Figure 7B:
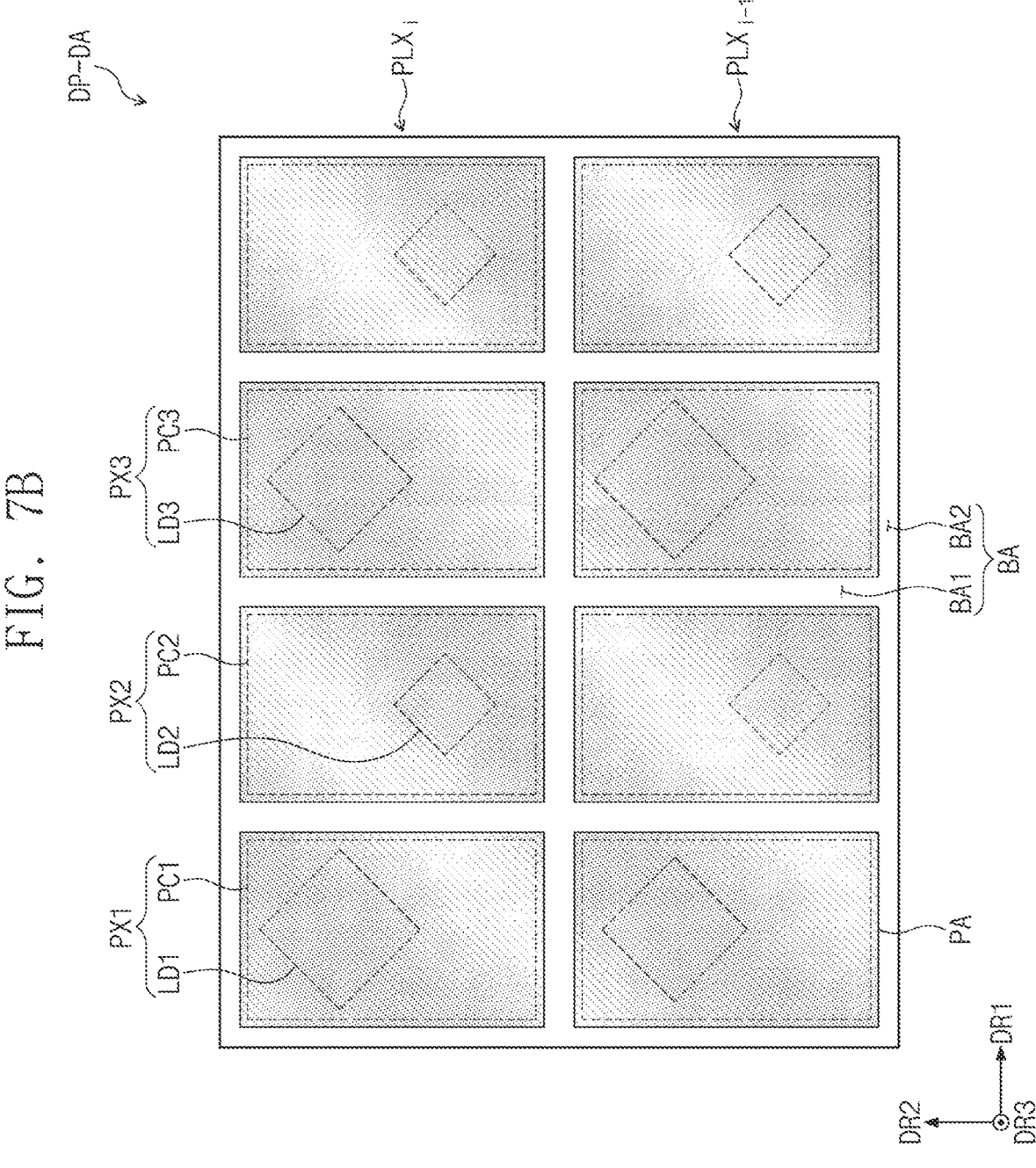
FIG. 7B is a plan view illustrating a display panel according to an embodiment.
Figure 7C:
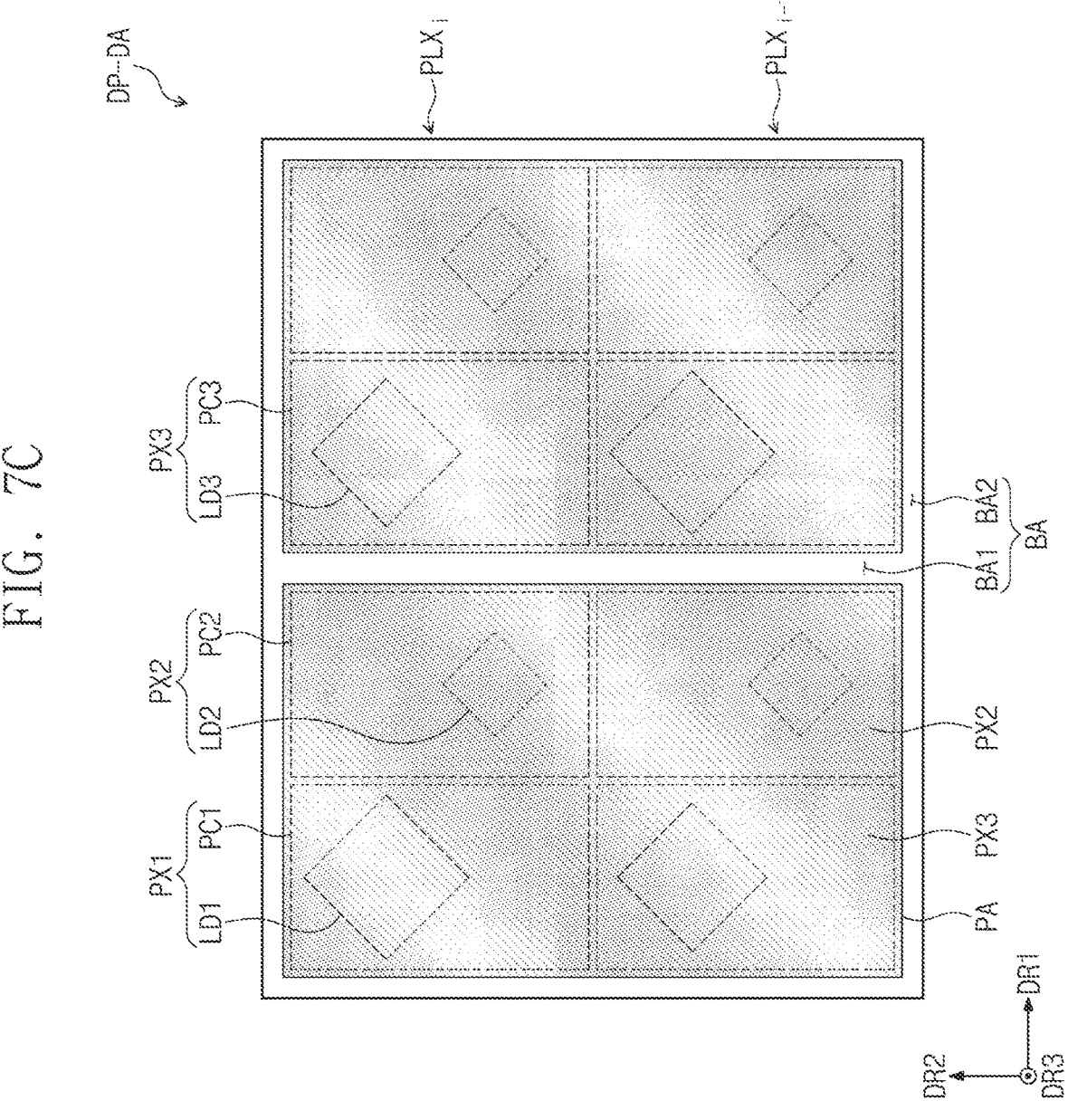
FIG. 7C is a plan view illustrating a display panel according to an embodiment.

FIGS. 7B and 7C are enlarged plan views of the display panel DP according to embodiments, and show a display area DP-DA. FIGS. 7B and 7C differ from those of FIG. 7A in that the number of light emitting elements disposed in the pixel area PA is different.

Referring to FIG. 7B, any one of a first color pixel PX1, a second color pixel PX2, and a third color pixel PX3 is disposed in each pixel area PA, and each of the pixel areas PA may be surrounded by a boundary area BA. That is, FIG. 7B shows that one pixel is disposed in one pixel area PA. Also, unlike FIG. 7A, in FIG. 7B, the first color pixel PX1 and the second color pixel PX2 are shown to be spaced apart with the first boundary area BA1 therebetween.

Referring to FIG. 7C, one first color pixel PX1, one third color pixel PX3, and two second color pixels PX2 may be disposed in one pixel area PA. Each of the pixel areas PA may be surrounded by a boundary area BA. That is, FIG. 7C shows that four pixels are arranged in one pixel area PA. Also, unlike FIG. 7A, in FIG. 7C, the pixels of the i-th pixel row PLXi and the (i−1)-th pixel row PLXi−1 constitute one pixel area PA.

Figure 8A:
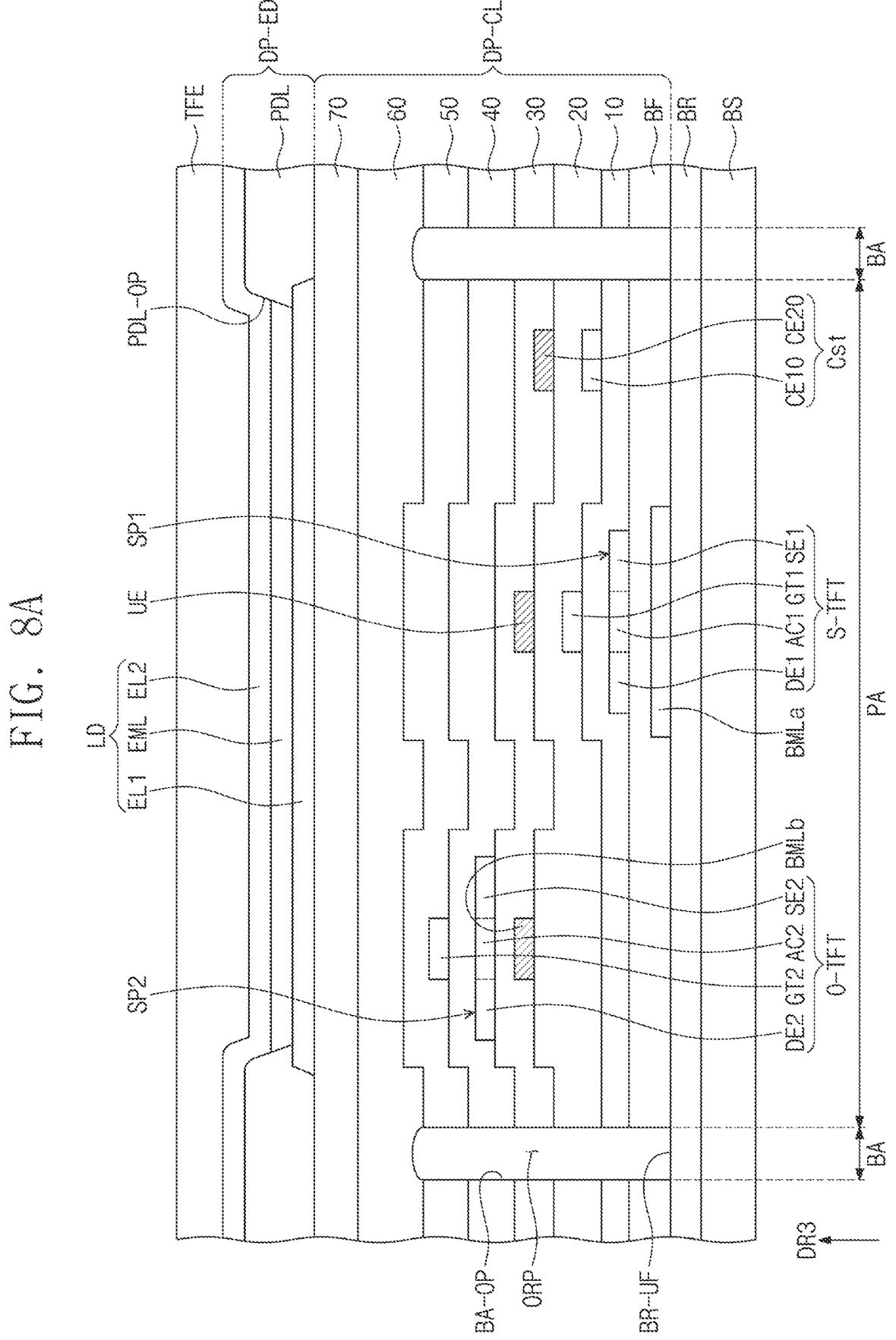
FIG. 8A is a cross-sectional view illustrating a display panel according to an embodiment.
Figure 8B:
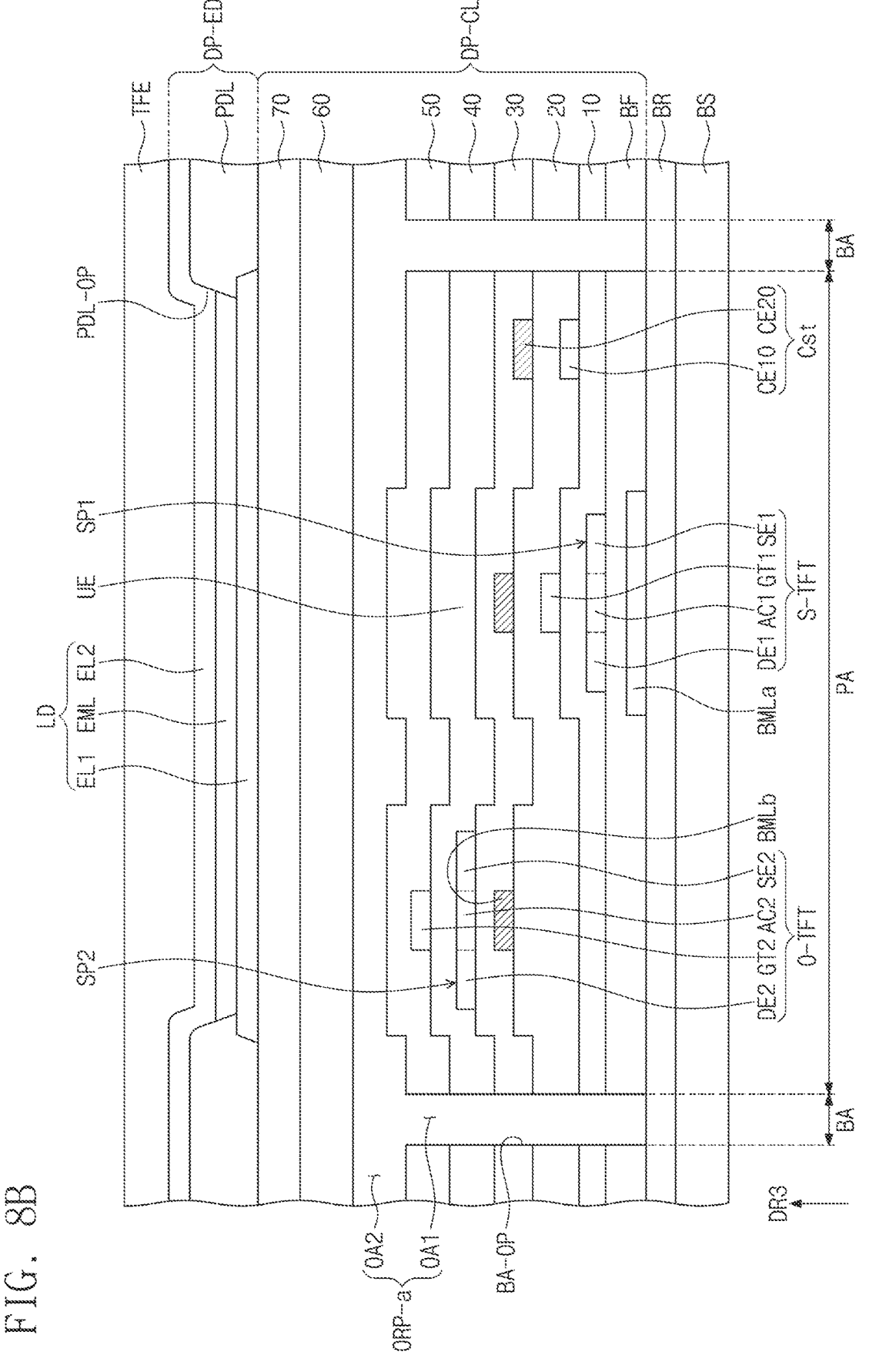
FIG. 8B is a cross-sectional view illustrating a display panel according to an embodiment.

FIGS. 8A and 8B are cross-sectional views illustrating a display panel DP according to an embodiment, and the display panel DP of FIG. 4 may be more specifically illustrated.

FIGS. 8A and 8B show one light emitting element LD, a silicon transistor S-TFT, and an oxide transistor O-TFT. In the equivalent circuit shown in FIG. 6, among the first to seventh transistors T1, T2, T3, T4, T5, T6, and T7, the third and fourth transistors T3 and T4 may be oxide transistors O-TFT, and the remaining transistors T1, T2, T5, T6, and T7 may be silicon transistors S-TFT. In another embodiment, the pixel circuit PC may include only one type of a silicon transistor S-TFT and an oxide transistor O-TFT. In the description of FIGS. 8A and 8B, the silicon transistor S-TFT is described as the first transistor T1 in FIG. 6, and the oxide transistor O-TFT is described as the third transistor T3 in FIG. 6.

A barrier layer BR may be disposed on the upper side of the base layer BS. The barrier layer BR may prevent foreign substances from being introduced from the outside. The barrier layer BR may include at least one inorganic layer. For example, the barrier layer BR may include a silicon oxide layer and/or a silicon nitride layer. Each of the silicon oxide layer and the silicon nitride layer may be provided in plurality, and the silicon oxide layers and the silicon nitride layers may be alternately stacked.

A first shielding electrode BMLa may be disposed on the upper side of the barrier layer BR. The first shielding electrode BMLa may include metal. The first shielding electrode BMLa may include molybdenum (Mo) having good heat resistance, an alloy containing molybdenum, titanium (Ti), or an alloy containing titanium. The first shielding electrode BMLa may receive a bias voltage. The first shielding electrode BMLa may receive the first power voltage ELVDD. The first shielding electrode BMLa may block an electrical potential due to polarization from affecting the silicon transistor S-TFT. The first shielding electrode BMLa may block external light from reaching the silicon transistor S-TFT. Meanwhile, the first shielding electrode BMLa may be a floating electrode in a form isolated from other electrodes or wires.

A buffer layer BF may be disposed on the barrier layer BR. The buffer layer BF may prevent diffusion of metal atoms or impurities from the base layer BS to the first semiconductor pattern SP1 disposed thereon. The buffer layer BF may include at least one inorganic layer. The buffer layer BF may include a silicon oxide layer and/or a silicon nitride layer.

A first semiconductor pattern SP1 may be disposed on the buffer layer BF. The first semiconductor pattern SP1 may include a silicon semiconductor. For example, the silicon semiconductor may include amorphous silicon, polycrystalline silicon, or the like. More specifically, the first semiconductor pattern SP1 may include low-temperature polysilicon.

FIGS. 8A and 8B show a portion of the first semiconductor pattern SP1, and the first semiconductor pattern SP1 may be further disposed in another area. The first semiconductor pattern SP1 may be arranged in a specific rule over the pixel area PA (see FIGS. 7A to 7C). The first semiconductor pattern SP1 may have different electrical properties depending on whether it is doped or not. The first semiconductor pattern SP1 may include a first portion having high conductivity and a second portion having low conductivity. The first area may be doped with an N-type dopant or a P-type dopant. The P-type transistor may include a doped portion doped with a P-type dopant, and the N-type transistor may include a doped portion doped with an N-type dopant. The second portion may be an undoped portion or a portion doped at a lower concentration than the first portion.

The conductivity of the first portion may be greater than that of the second portion, and the first portion may substantially serve as an electrode or a signal line. The second portion may substantially correspond to a channel area of the transistor. A channel area may also be named an active area. That is, a portion of the first semiconductor pattern SP1 may be a channel of the transistor, another portion may be a source or drain of the transistor, and another portion may be a connection electrode or a connection signal line.

The source area SE1, channel area AC1, and drain area DE1 of the silicon transistor S-TFT may be formed from the first semiconductor pattern SP1. The source area SE1 and the drain area DE1 may extend in opposite directions from the channel area AC1 on a cross section.

The first insulating layer 10 may be disposed on the buffer layer BF. The first insulating layer 10 may cover the first semiconductor pattern SP1. The first insulating layer 10 may be an inorganic layer. The first insulating layer 10 may include at least one of aluminum oxide, titanium oxide, silicon oxide, silicon nitride, silicon oxynitride, zirconium oxide, and hafnium oxide. The first insulating layer 10 may be a single layer of silicon oxide. Each of the first insulating layer 10 and the second to fifth insulating layers 20, 30, 40, and 50 to be described below may have a single-layer or multi-layer structure and may include at least one of the above materials but is not limited thereto.

A gate GT1 of the silicon transistor S-TFT may be disposed on the first insulating layer 10. The gate GT1 may be a part of the metal pattern. The gate GT1 may overlap the channel area AC1 in a plan view. In a process of doping the first semiconductor pattern SP1, the gate GT1 may be a mask. The gate GT1 may include molybdenum (Mo) having good heat resistance, an alloy containing molybdenum, titanium (Ti), or an alloy containing titanium, but is not limited thereto.

A first electrode CE10 of the storage capacitor Cst may be disposed on the first insulating layer 10. Unlike what is shown, the first electrode CE10 may have a shape integral with the gate GT1.

A second insulating layer 20 is disposed on the first insulating layer 10, and the second insulating layer 20 may cover the gate GT1. An upper electrode UE overlapping the gate GT1 in a plan view may be disposed on the second insulating layer 20. A second electrode CE20 overlapping the first electrode CE10 may be disposed on the second insulating layer 20. Unlike those shown in FIGS. 8A and 8B, the second electrode CE20 may have an integral shape with the upper electrode UE in another embodiment. The second electrode CE20 and the upper electrode UE may include molybdenum (Mo) having good heat resistance, an alloy containing molybdenum, titanium (Ti), or an alloy containing titanium.

A second shielding electrode BMLb may be disposed on the upper side of the second insulating layer 20. The second shielding electrode BMLb may be disposed to correspond to a lower portion of the oxide transistor O-TFT. Unlike shown, the second shielding electrode BMLb may be omitted. The first shielding electrode BMLa may extend to the bottom of the oxide transistor O-TFT to replace the second shielding electrode BMLb. When the oxide transistor O-TFT includes two gates, the second shielding electrode BMLb may be a gate disposed below the oxide transistor O-TFT.

A third insulating layer 30 may be disposed on the second insulating layer 20. The second semiconductor pattern SP2 may be disposed on the third insulating layer 30. The second semiconductor pattern SP2 may include a channel area AC2 of the oxide transistor O-TFT.

The source area SE2, channel area AC2, and drain area DE2 of the oxide transistor O-TFT may be formed from the second semiconductor pattern SP2. The source area SE2 and the drain area DE2 may extend in opposite directions from the channel area AC2 on a cross section.

The second semiconductor pattern SP2 may include an oxide semiconductor. The second semiconductor pattern SP2 may include transparent conductive oxide ("TCO") such as indium tin oxide ("ITO"), indium zinc oxide ("IZO"), indium gallium zinc oxide (IGZO), zinc oxide (ZnOx) or indium oxide ($In_2O_3$). The zinc oxide (ZnOx) may be zinc oxide (ZnO) and/or zinc peroxide ($ZnO_2$).

The oxide semiconductor may include a plurality of areas divided according to whether the transparent conductive oxide is reduced. An area in which the transparent conductive oxide is reduced (hereinafter, a reduced area) has greater conductivity than an area in which the transparent conductive oxide is reduced (hereinafter, a non-reduced area). The reduced area actually serves as the source/drain or signal line of the transistor. The reduced area substantially corresponds to the semiconductor area (or channel) of the transistor. That is, a portion of the second semiconductor pattern SP2 may be a semiconductor area of the transistor, another area may be a source area/drain area of the transistor, and another portion may be a signal transmission area.

A fourth insulating layer 40 may be disposed on the third insulating layer 30. The fourth insulating layer 40 may cover the second semiconductor pattern SP2. A gate GT2 of the oxide transistor O-TFT may be disposed on the fourth insulating layer 40. In one embodiment, an oxide transistor O-TFT may include two gates, and the two gates may be the second shielding electrode BMLb on the upper side of the second insulating layer 20 and the gate GT2 disposed on the upper side of the fourth insulating layer 40. The second shielding electrode BMLb on the upper side of the second insulating layer 20 and the gate GT2 disposed on the upper side of the fourth insulating layer 40 may be electrically connected.

A gate GT2 of the oxide transistor O-TFT may be a part of a metal pattern. A gate GT2 of the oxide transistor O-TFT may overlap the channel area AC2 in a plan view. The gate GT2 may include molybdenum (Mo) having good heat resistance, an alloy containing molybdenum, titanium (Ti), or an alloy containing titanium. For example, the gate GT2 may include a titanium layer and a molybdenum layer disposed on the titanium layer.

A fifth insulating layer 50 is disposed on the fourth insulating layer 40, and the fifth insulating layer 50 may cover the gate GT2. Each of the first insulating layer 10 to the fifth insulating layer 50 may be an inorganic layer.

Organic insulating layers 60 and 70 may be disposed on the fifth insulating layer 50. The first organic insulating layer 60 may be disposed on the fifth insulating layer 50, and the second organic insulating layer 70 may be disposed on the first organic insulating layer 60.

The first organic insulating layer 60 may have a flat upper surface by removing a step of the fifth insulating layer 50 disposed below the first organic insulating layer 60. The first organic insulating layer 60 may overlap the entirety the base layer BS.

Each of the first organic insulating layer 60 and the second organic insulating layer 70 may include Benzocyclobutene ("BCB"), polyimide, Hexamethyldisiloxane ("HMDSO"), Polymethylmethacrylate ("PMMA"), or general purpose polymers such as polystyrene ("PS"), polymer derivatives having phenolic groups, acrylic polymers, imide-based polymers, arylether-based polymers, amide-based polymers, fluorine-based polymers, p-xylene-based polymers, vinyl alcohol-based polymers, blends thereof, and the like.

The first electrode EL1 of the light emitting element LD may be disposed on the second organic insulating layer 70. The light emitting element LD includes a first electrode EL1, a second electrode EL2 disposed over the first electrode EL1, and a light emitting layer EML disposed between the first electrode EL1 and the second electrode EL2. The second electrode EL2 may be commonly provided to the first to third light emitting elements LD1, LD2, and LD3 shown in FIGS. 7A to 7C. The first electrode EL1 and the light emitting layer EML may be provided to the first to third light emitting elements LD1, LD2, and LD3, respectively.

The first electrode EL1 may be a transparent electrode, a translucent electrode, or a reflective electrode. The first electrode EL1 may include a reflective layer formed of or include Ag, Mg, Al, Pt, Pd, Au, Ni, Nd, Ir, Cr, or a compound thereof, and a transparent or semi-transparent electrode layer formed on the reflective layer. The transparent or semi-transparent electrode layer may include at least one or more selected from the group consisting of indium tin oxide (ITO), indium zinc oxide (IZO), indium gallium zinc oxide ("IGZO"), zinc oxide (ZnOx) or indium oxide ($In_2O_3$), and aluminum doped zinc oxide ("AZO"). For example, the first electrode EL1 may have a three-layer structure of ITO/Ag/ ITO, but is not limited thereto.

A pixel defining film PDL may be disposed on the second organic insulating layer 70. The pixel defining film PDL may have a transparent property or a light absorbing property. For example, the pixel defining film PDL that absorbs light may include a black coloring agent. The black coloring agent may include a black dye or a black pigment. The black component may include a metal such as carbon black or chromium, or an oxide thereof. The pixel defining film PDL may correspond to a light blocking pattern having light blocking characteristics.

The pixel defining film PDL may cover a portion of the first electrode EL1. For example, a pixel opening PDL-OP exposing a portion of the first electrode EL1 may be defined in a pixel defining film PDL. The pixel defining film PDL may increase the distance between the edge of the first electrode EL1 and the second electrode EL2. Accordingly, it may prevent an arc or the like from occurring at the edge of the first electrode EL1 by the pixel defining film PDL.

Although not shown, at least one of a hole transport layer, a hole injection layer, and an electron blocking layer may be disposed between the first electrode EL1 and the light emitting layer EML. At least one of an electron transport layer, an electron injection layer, and a hole blocking layer may be disposed between the light emitting layer EML and the second electrode EL2.

Figure 9:
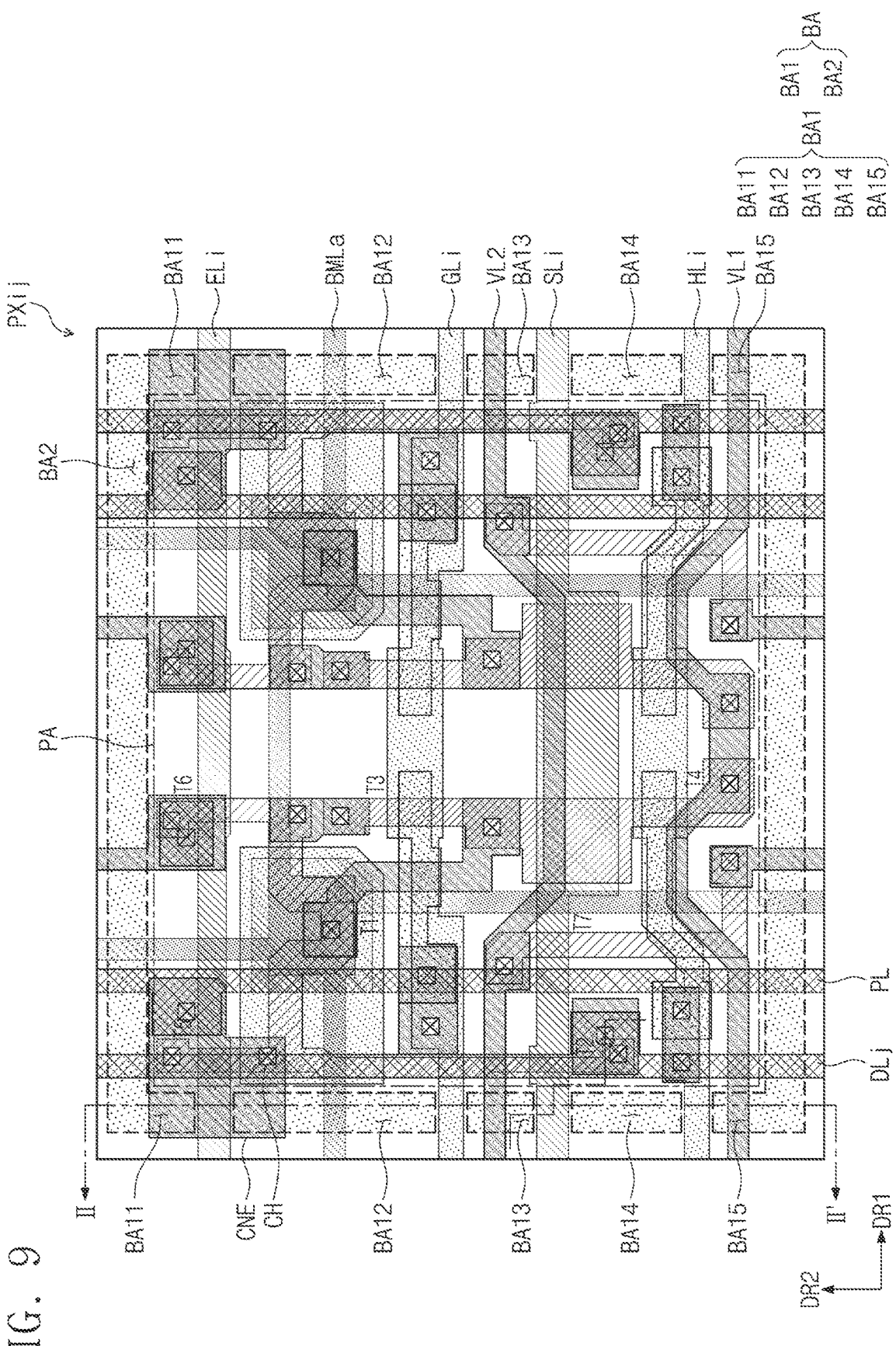
FIG. 9 is a plan view illustrating components arranged in a pixel area according to an embodiment.

The buffer layer BF and the first to fifth insulating layers 10, 20, 30, 40, and 50 may be defined as an inorganic laminated structure. An opening BA-OP may be defined in the inorganic laminated structure. The opening BA-OP may correspond to the boundary area BA described with reference to FIGS. 7A to 7C. In FIGS. 7A to 7C, first to fifth boundary parts BAH, BA12, BA13, BA14, BA15 of FIG. 9 are omitted for convenience of description.

The inorganic stacked structure may be divided into a plurality of islands corresponding to the plurality of pixels PX1, PX2, and PX3 shown in FIGS. 7A to 7C. Each of the plurality of islands may include at least one pixel area PA and a boundary area BA adjacent to the at least one pixel area PA. Since the plurality of islands may disperse external impact, generation of cracks in the inorganic laminated structure due to external impact may be prevented.

In one embodiment, the organic layer ORP may be disposed while filling the opening BA-OP. The opening BA-OP may pass through the buffer layer BF and the first to fifth insulating layers 10, 20, 30, 40, and 50. The opening BA-OP may expose one surface of the component disposed on the lower side of the buffer layer BF. That is, the opening BA-OP may expose the upper surface BR-UF of the barrier layer BR. Accordingly, the lower surface of the organic layer ORP may contact the barrier layer BR disposed below the buffer layer BF, and the upper surface of the organic layer ORP may contact the first organic insulating layer 60 disposed on the fifth insulating layer 50. The first organic insulating layer 60 may cover the organic layer ORP. The first organic insulating layer 60 may contact the organic layer ORP and the fifth insulating layer 50.

Compared to FIG. 8A, FIG. 8B differs in that the organic layer ORP-a includes the second portion OA2 extended perpendicular to the thickness direction DR3. When the organic layer ORP-a of FIG. 8B does not include the second portion OA2, it may be formed as the organic layer ORP shown in FIG. 8A.

In one embodiment, the organic layer ORP-a may include a first portion OA1 extended parallel to the thickness direction DR3 and a second portion OA2 extended perpendicular to the thickness direction DR3. The first portion OA1 may be a portion filling the opening BA-OP corresponding to the boundary area BA. The second portion OA2 may extend from the first portion OA1 and overlap the pixel area PA and the boundary area BA. In the organic layer ORP-a, the second portion OA2 and the first portion OA1 may have an integral shape (i.e., monolithic). The second portion OA2 may overlap the entirety of the base layer BS. The second portion OA2 may have a flat upper surface by removing a step difference between the first to fifth insulating layers 10, 20, 30, 40, and 50 disposed on the lower side.

FIG. 9 is a plan view illustrating a partial configuration of the pixel PXij, the contact hole CH, and the connection electrode CNE described with reference to FIG. 6. The contact hole CH and the connection electrode CNE may electrically connect elements of the pixel PXij and a signal line.

Specifically, among the components of the pixel PXij, the first to seventh transistors T1, T2, T3, T4, T5, T6, and T7, the i-th scan line SLi of the first group, the i-th scan line GLi of the second group line, the i-th scan line HLi of the third group, the i-th emission line ELi, the first voltage line PL, the second voltage line VL1, the third voltage line VL2, and the j-th data line DLj are illustrated in FIG. 9. However, the connection relationship between the components of the pixel PXij illustrated in FIG. 9 is exemplary and is not limited to any one embodiment.

Referring to FIG. 9, the i-th scan line SLi of the first group, the i-th scan line GLi of the second group, the i-th scan line HLi of the third group, and the i-th emission line ELi may be not overlapping in the boundary area BA and overlapping in the pixel area PA in a plan view. The i-th scan line SLi of the first group, the i-th scan line GLi of the second group, the i-th scan line HLi of the third group, and the i-th emission line ELi may extend in the first direction DR1. In the second direction DR2, the i-th scan line SLi of the first group, the i-th scan line GLi of the second group, the i-th scan line HLi of the third group, and the i-th emission line ELi may be not overlapping with the first boundary area BA1. The first boundary area BA1 may extend in the second direction DR2.

The first boundary area BA1 may include first to fifth boundary parts BA11, BA12, BA13, BA14, and BA15 spaced apart from each other in the second direction DR2. The first boundary part BA11 and the second boundary part BA12 may be spaced apart with the i-th emission line ELi therebetween. The second boundary part BA12 and the third boundary part BA13 may be spaced apart with the i-th scan line GLi of the second group therebetween. The third boundary part BA13 and the fourth boundary part BA14 may be spaced apart with the i-th scan line SLi of the first group therebetween. The fourth boundary part BA14 and the fifth boundary part BA15 may be spaced apart with the i-th scan line HLi of the third group therebetween. The i-th scan line SLi of the first group, the i-th scan line GLi of the second group, the i-th scan line HLi of the third group, and the i-th emission line ELi may be disposed on an upper side of any one insulating layer among the first to fifth insulating layers 10, 20, 30, 40, and 50 in which an opening BA-OP is defined. Any two signal lines of the i-th scan line SLi of the first group, the i-th scan line GLi of the second group, the i-th scan line HLi of the third group, and the i-th emission line Eli may be disposed on the same insulating layer, and the remaining two signal lines may be disposed on another identical insulating layer.

The number of boundary parts included in the first boundary area BA1 is not limited to that shown, and may vary according to the number of signal lines disposed on one surface of insulating layers in which openings BA-OP are defined. For example, when a signal line is disposed on one side of each of three insulating layers among insulating layers in which an opening BA-OP is defined, there may be four boundary parts. In addition, when the signal line disposed on one surface of the insulating layers in which the opening BA-OP is defined extends in the second direction DR2, the second boundary area BA2 extending in the first direction DR1 may include boundary parts spaced apart from each other.

In islands containing a pixel area and a boundary area, a portion of signal lines overlapping the boundary area may be disconnected in a display panel whose boundary area does not include a boundary part. When disconnection occurs in the signal lines, a metal layer or the like is required to be added to connect the signal lines, which reduces the efficiency of the manufacturing process. Alternatively, the portion overlapping the signal lines in the boundary area in a plan view forms a relatively shallow opening. For example, in relation to a display panel whose boundary area does not include a boundary part, in areas overlapping the signal lines, no openings are formed in the first insulating layer and the buffer layer, but openings are formed only in the second to fifth insulating layers. The area where the relatively shallow opening is formed is vulnerable to external impact.

The display panel DP according to an embodiment may include first to fifth boundary parts BA11, BA12, BA13, BA14, and BA15 spaced apart from each other with the signal lines ELi, GLi, SLi, and HLi therebetween. The organic layer ORP may include first to fifth sub organic layers OL1, OL2, OL3, OL4, and OL5 corresponding to the first to fifth boundary parts BAH, BA12, BA13, BA14, and BA15. The first to fifth sub organic layers OL1, OL2, OL3, OL4, and OL5 may fill the opening BA-OP penetrating the buffer layer BF and the first to fifth insulating layers 10, 20, 30, 40, and 50 and may be disposed. Accordingly, the display panel DP according to an embodiment may exhibit excellent impact resistance and reliability. The display panel DP according to an embodiment is formed by a method of manufacturing a display panel according to an embodiment, which will be described later, and the display panel manufacturing method according to an embodiment may exhibit improved manufacturing efficiency and reduced manufacturing cost.

Figure 10A:
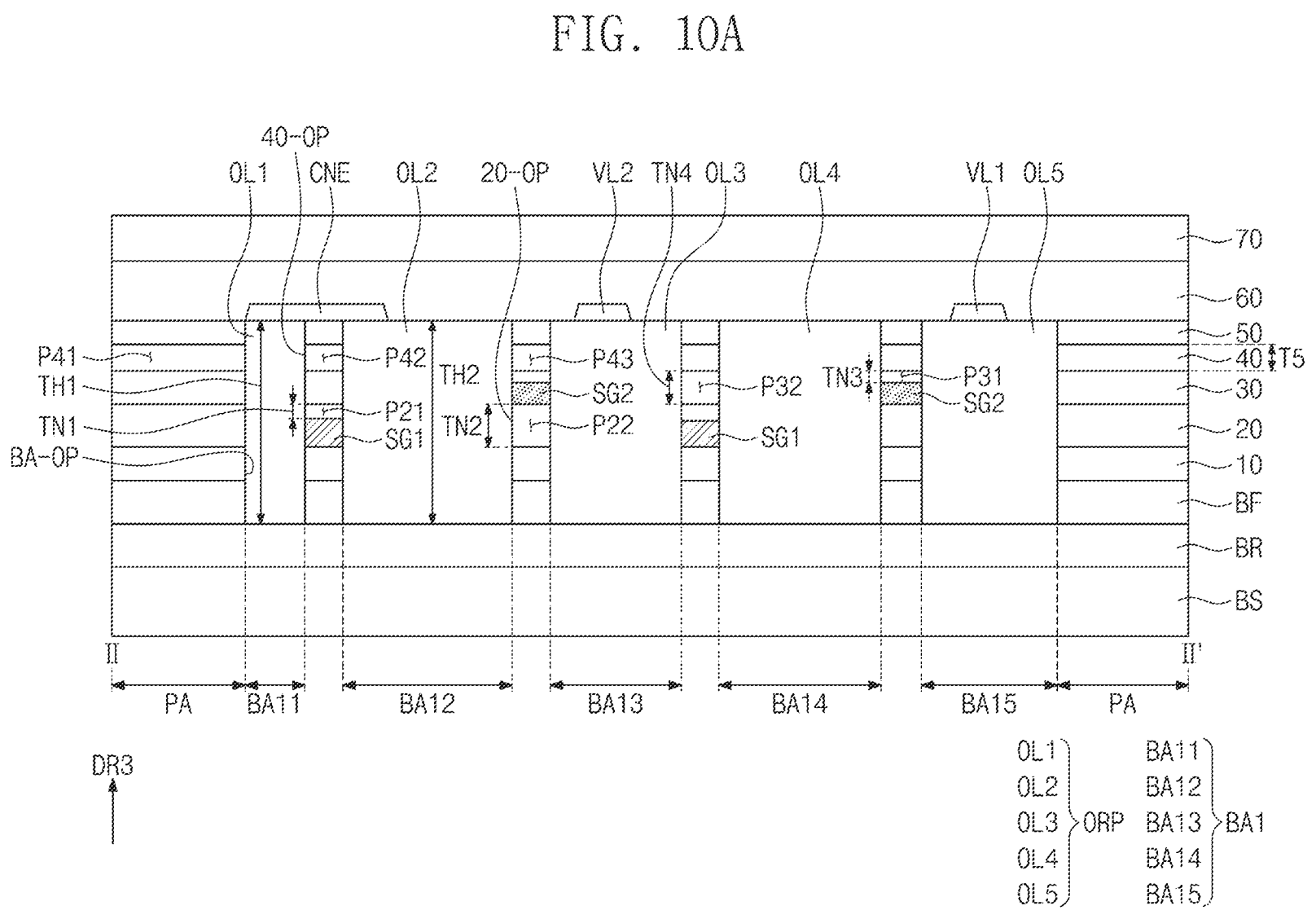

FIG. 10A is a cross-sectional view showing a portion corresponding to line II-IP of FIG. 9. FIG. 10A illustrates the first signal line SG1 disposed on the first insulating layer 10 and the second signal line SG2 disposed on the second insulating layer 20. The first signal line SG1 may be disposed on the same layer (i.e., the first insulating layer 10) as the gate GT1 of the silicon transistor S-TFT (see FIGS. 8A and 8B). The first signal line SG1 may include the i-th scan line SLi of the first group and the i-th emission line ELi shown in FIG. 9. The second signal line SG2 may be disposed on the same layer (i.e., the second insulating layer 20) as the upper electrode UE (see FIGS. 8A and 8B). The second signal line SG2 may include the i-th scan line GLi of the second group and the i-th scan line HLi of the third group shown in FIG. 9.

Referring to FIG. 10A, the organic layer ORP may include first to fifth sub organic layers OL1, OL2, OL3, OL4, and OL5 disposed to correspond to the first to fifth boundary parts BA11, BA12, BA13, BA14, and BA15. The first sub organic layer OL1 may be disposed to correspond to the first boundary part BA11, and the second sub organic layer OL2 may be disposed to correspond to the second boundary part BA12. The third sub organic layer OL3 may be disposed to correspond to the third boundary part BA13, and the fourth sub organic layer OL4 may be disposed to correspond to the fourth boundary part BA14. The fifth sub organic layer OL5 may be disposed to correspond to the fifth boundary part BA15.

The first to fifth sub organic layers OL1, OL2, OL3, OL4, and OL5 may not overlap the first and second signal lines SG1 and SG2 in a plan view. The first sub organic layer OL1 and the second sub organic layer OL2 may be spaced apart with the first signal line SG1 therebetween. The second sub organic layer OL2 and the third sub organic layer OL3 may be spaced apart with the second signal line SG2 interposed therebetween. In one direction perpendicular to the thickness direction DR3, the first to fifth sub organic layers OL1, OL2, OL3, OL4, and OL5 may be spaced apart from each other.

The thickness TH1 of the first sub organic layer OL1 and the thickness TH2 of the second sub organic layer OL2 may be the same. The depth (i.e., thickness TH1) of the opening where the first sub organic layer OL1 is disposed may be the same as the depth (i.e., thickness TH2) of the opening where the second sub organic layer OL2 is disposed. The first to fifth sub organic layers OL1, OL2, OL3, OL4, and OL5 may have substantially the same thickness. In this specification, substantially the same includes not only the case where numerical values are physically the same, but also the case where there is a difference within an error range in a process that may generally occur.

The second insulating layer 20 covering the first signal line SG1 may include a first insulating part P21 overlapping the first signal line SG1 and a second insulating part P22 not overlapping the first signal line SG1 in a plan view. A thickness TN1 of the first insulating part P21 may be smaller than a thickness TN2 of the second insulating part P22. That is, in the second insulating layer 20, the first insulating part P21 overlapping the first signal line SG1 may have a relatively thin thickness. A thickness TN2 of the second insulating part P22 may be substantially the same as a thickness of a portion of the second insulating layer 20 overlapping the pixel area PA. The lower surface of the first insulating part P21 and the lower surface of the second insulating part P22 may be disposed on different planes. The upper surface of the first insulating part P21 and the upper surface of the second insulating part P22 may be disposed on the same plane. A second signal line SG2 may be disposed above the second insulating part P22.

The first insulating part P21 and the second insulating part P22 may not overlap the organic layer ORP in a plan view. A first opening 20-OP may be defined between the first insulating part P21 and the second insulating part P22. The first opening 20-OP penetrating the second insulating layer

20 may constitute an opening BA-OP passing through the buffer layer BF and the first to fifth insulating layers 10, 20, 30, 40, and 50.

The third insulating layer 30 covering the second signal line SG2 may include a third insulating part P31 overlapping the second signal line SG2 and a fourth insulating part P32 overlapping the second signal line SG2. A thickness TN3 of the third insulating part P31 may be smaller than a thickness TN4 of the fourth insulating part P32. That is, in the third insulating layer 30, the third insulating part P31 overlapping the second signal line SG2 in a plan view may have a relatively thin thickness. A thickness TN4 of the fourth insulating part P32 may be substantially the same as a thickness of a portion of the third insulating layer 30 overlapping the pixel area PA. The lower surface of the third insulating part P31 and the lower surface of the fourth insulating part P32 may be disposed on different planes. The upper surface of the third insulating part P31 and the upper surface of the fourth insulating part P32 may be disposed on the same plane. The third insulating part P31 and the fourth insulating part P32 may not overlap with the organic layer ORP in a plan view.

The fourth insulating layer 40 disposed above the first and second signal lines SG1 and SG2 and spaced apart from the first and second signal lines SG1 and SG2 may have a uniform thickness T5. In the fourth insulating layer 40, the thickness of the portions P42 and P43 (hereinafter referred to as sixth and seventh insulating parts) overlapping the first and second signal lines SG1 and SG2, respectively, may be the same as the thickness of the portion P41 (hereinafter referred to as fifth insulating part) that does not overlap the first and second signal lines SG1 and SG2.

In an embodiment, in the fourth insulating layer 40, the fifth insulating part P41 may be a portion that does not overlap the first and second signal lines SG1 and SG2 and overlaps the pixel area PA. The thickness of the fifth insulating part P41 overlapping the first and second signal lines SG1 and SG2 may be substantially the same as the thickness of the sixth insulating part P42 overlapping the first signal line SG1. In an embodiment, in the fourth insulating layer 40, the thickness of the seventh insulating part P43 overlapping the second signal line SG2 may be substantially the same as the thickness of the fifth insulating part P41 that does not overlap the first and second signal lines SG1 and SG2.

The fifth to seventh insulating parts P41, P42, and P43 may not overlap the organic layer ORP in a plan view. A second opening 40-OP may be defined between the fifth insulating part P41 and the sixth insulating part P42. The second opening 40-OP penetrating the fourth insulating layer 40 may constitute a part of the opening BA-OP passing through the buffer layer BF and the first to fifth insulating layers 10, 20, 30, 40, and 50.

The fifth insulating layer 50 disposed above the first and second signal lines SG1 and SG2 and spaced apart from the first and second signal lines SG1 and SG2 may have a uniform thickness. In the fifth insulating layer 50, the thickness of the portion overlapping the first and second signal lines SG1 and SG2 and the thickness of the portion not overlapping the first and second signal lines SG1 and SG2 may be the same.

Figure 10B:
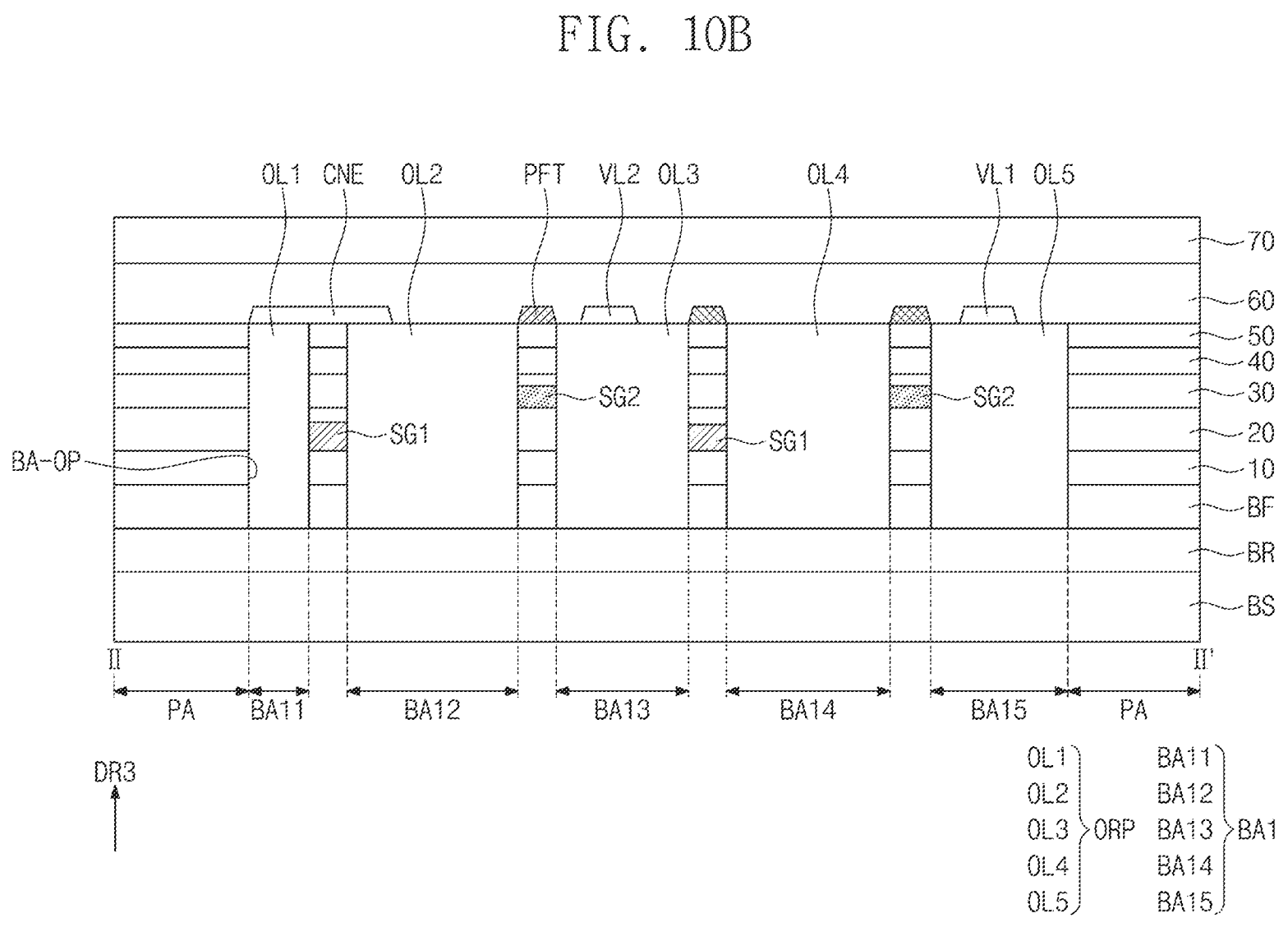

FIG. 10B is different from FIG. 10A in that a protective pattern PFT is disposed above the first and second signal lines SG1 and SG2. The protective pattern PFT may be disposed in one area of the fifth insulating layer 50 overlapping the first and second signal lines SG1 and SG2. The protective pattern PFT may not overlap with the organic layer ORP in a plan view. The protective pattern PFT may include a metal material. The protective pattern PFT may prevent an opening BA-OP from being formed in one area of the buffer layer BF and the first to fifth insulating layers 10, 20, 30, 40, and 50 overlapping the first and second signal lines SG1 and SG2. In the display panel DP including the protective pattern PFT, damage to the first and second signal lines SG1 and SG2 may be effectively prevented.

Table 1 below shows the results of a pen drop test on the display devices of Comparative Examples and Examples. The pen used in the pen drop test was used with a ball size of 0.3φ (pi).

The display devices of Comparative Examples 1 to 3 and Embodiment 1 include a display panel and a window disposed above the display panel. The window is to include Ultra Thin Glass (UTG).

The display device of Comparative Example 1 includes a display panel in which no boundary area is formed. In the display device of Comparative Example 2, the display panel has openings formed only in the fourth and fifth insulating layers, and no openings are formed in the buffer layer and the first to third insulating layers. In the display device of Comparative Example 3, the display panel has openings formed only in the second to fifth insulating layers, and no openings are formed in the buffer layer and the first insulating layer. The display device of Embodiment 1 includes a display panel according to an embodiment, and as shown in FIG. 8A, openings BA-OP are formed in the buffer layer BF and the first to fifth insulating layers 10, 20, 30, 40, and 50. The display devices of Comparative Example 2, Comparative Example 3, and Embodiment 1 include an organic layer filling the opening.

In Table 1, the "bright point" indicates the minimum drop height of the pen at which no defect occurs on the display panel. "UTG crack" indicates the minimum drop height of the pen at which cracks do not occur in a window including UTG. The "non-folding area" is the height at which the pen is dropped to the non-folding area, and the "folding area" is the height at which the pen is dropped to the folding area.

TABLE 1

| | Non-folding area | | Folding area | |
| --- | --- | --- | --- | --- |
| Classification | Bright point | UTG crack | Bright point | UTG crack |
| Comparative Example 1 | 6.0 centimeters (cm) | 11.0 cm | 3.0 cm | 6.0 cm |
| Comparative Example 2 | 7.0 cm | 11.0 cm | 5.0 cm | 9.3 cm |
| Comparative Example 3 | 9.0 cm | 9.0 cm | 5.0 cm | 9.4 cm |
| Embodiment 1 | 12.0 cm | 11.0 cm | 9.0 cm | 10.0 cm |

Referring to Table 1, it may be seen that, compared to Comparative Examples 1 to 3, Embodiment 1 has a very high minimum drop height at which display panel defects do not occur. In addition, compared to Comparative Example 3, it may be seen that Embodiment 1 has a high minimum drop height at which cracks do not occur in the window. Embodiment 1 has openings penetrating the buffer layer and the first to fifth insulating layers, and has a relatively deep opening compared to Comparative Examples 2 and 3. The depth is parallel to the thickness direction, and as openings are formed to the layers disposed on the lower side in the thickness direction (i.e., the first insulating layer and the buffer layer), it is determined in Embodiment 1 that it exhibits robust characteristics against external shocks.

Accordingly, in one embodiment, a display panel formed with boundary areas corresponding to openings penetrating the buffer layer and the first to fifth insulating layers may exhibit excellent impact resistance.

Figure 11:
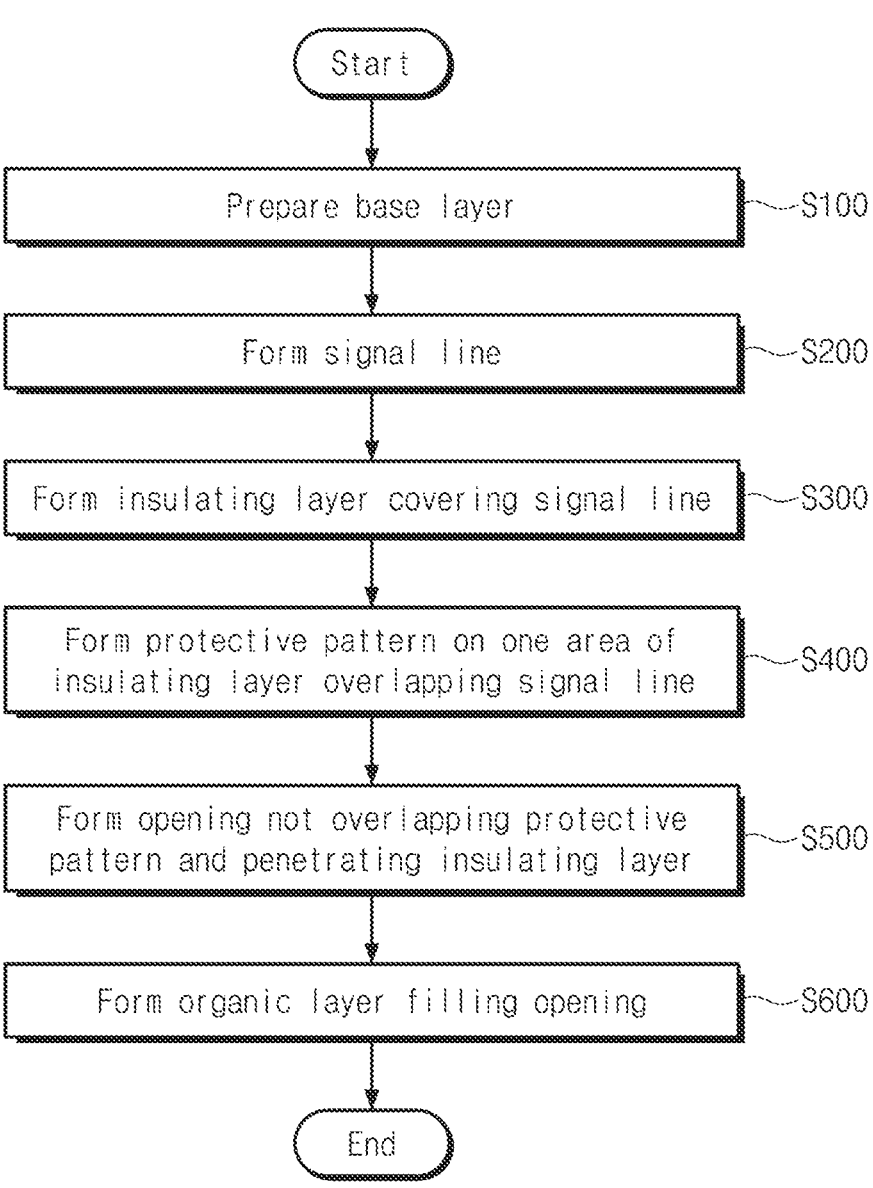
FIG. 11 is a flowchart illustrating a method of manufacturing a display panel according to an embodiment.

The display panel according to the embodiment may be formed by the method of manufacturing the display panel according to the embodiment. FIG. 11 is a flowchart illustrating a method of manufacturing a display panel according to an embodiment. FIGS. 12 to 14C schematically illustrate manufacturing operations of a display panel according to an embodiment. Hereinafter, in the description of a method of manufacturing a display panel according to an embodiment described with reference to FIGS. 11 to 14C, the content overlapping with the content described with reference to FIGS. 1 to 10B will not be described again, and differences will be mainly described.

Referring to FIG. 11, a method of manufacturing a display panel according to an embodiment may include preparing a base layer in S100, forming a first signal line on the upper side of the base layer in S200, forming a first insulating layer covering the first signal line in S300, forming a protective pattern on an area of the first insulating layer overlapping the first signal line in S400, forming an opening that does not overlap with the protective pattern and penetrates the first insulating layer in S500, and forming an organic layer filling the opening in S600. In one embodiment, the opening BA-OP (see FIGS. 13D and 14C) may correspond to the boundary area BA (see FIGS. 13D and 14C).

Figure 12:
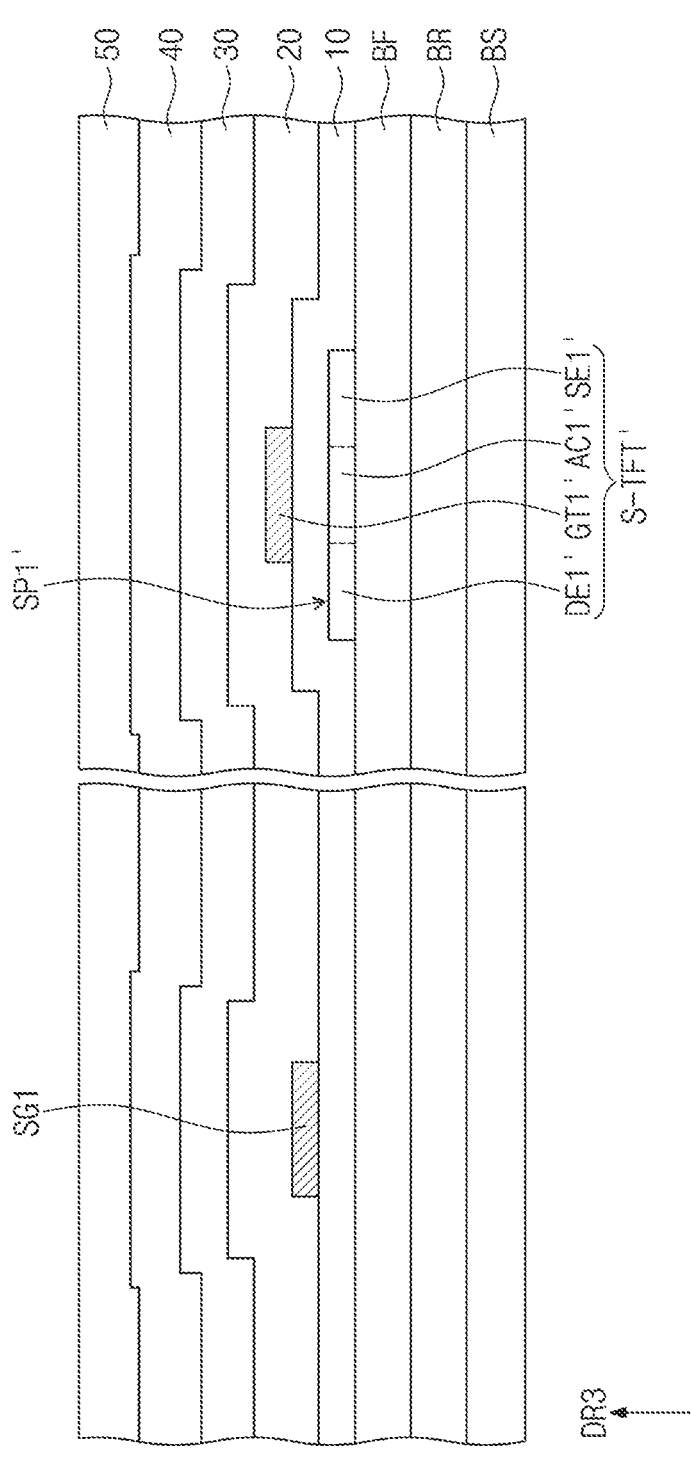
FIG. 12 schematically illustrates manufacturing steps of a display panel according to an embodiment.

Referring to FIG. 12, a first signal line SG1 may be formed on the first insulating layer 10. Before forming the first signal line SG1, forming the first semiconductor pattern SP1' on the upper side of the buffer layer BF and forming the first insulating layer 10 on the upper side of the first semiconductor pattern SP1' may be performed.

The first semiconductor pattern SP1' shown in FIG. 12 may include a silicon semiconductor. A silicon transistor S-TFT' including a drain area DE1', a source area SE1', and a channel area AC1' may be formed from the first semiconductor pattern SP1'. The silicon transistor S-TFT' shown in FIG. 12 may be any one of the first, second, fifth, sixth, and seventh transistors T1, T2, T5, T6, and T7. Although not shown, before forming the silicon transistor S-TFT', forming the first shielding electrode BMLa (see FIGS. 8A and 8B) may be performed. The gate GT1' of the silicon transistor S-TFT' may be formed in the same operation as the first signal line SG1. The gate GT1' may be formed on the first insulating layer 10.

After forming the first signal line SG1, a second insulating layer 20 may be formed. Although not shown, a second signal line SG2 (see FIGS. 10A and 10B) may be formed on the second insulating layer 20. A third insulating layer 30 is formed on the upper side of the second signal line SG2 (see FIGS. 10A and 10B), and an oxide transistor O-TFT (see FIGS. 8A and 8B) may be formed on the third insulating layer 30. A fourth insulating layer 40 is formed on the oxide transistor O-TFT (see FIGS. 8A and 8B), and a gate GT2 (see FIGS. 8A and 8B) of an oxide transistor O-TFT (see FIGS. 8A and 8B) may be formed on the fourth insulating layer 40.

Figure 13A:
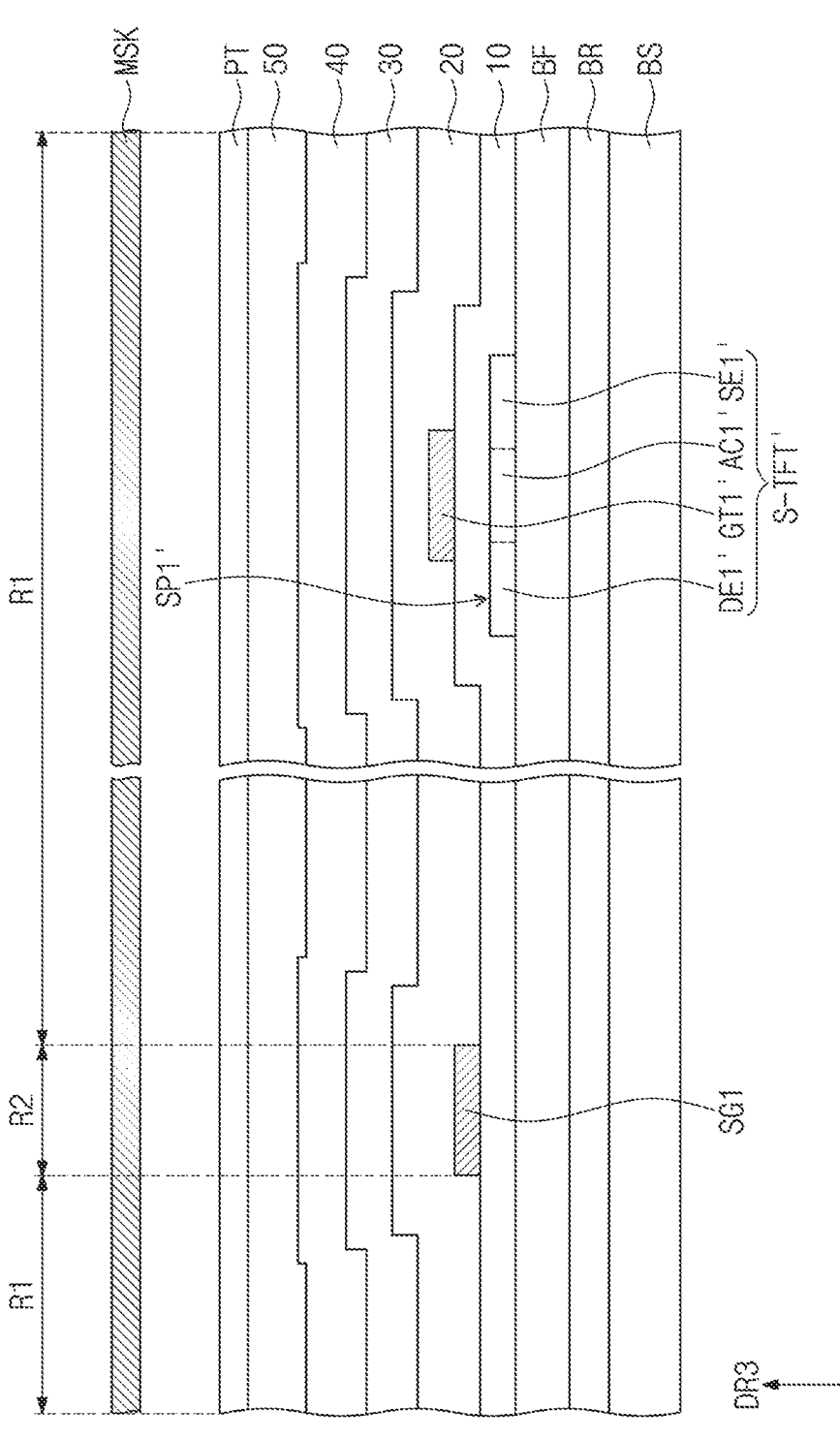
FIG. 13A schematically illustrates manufacturing steps of a display panel according to an embodiment.

Referring to FIG. 13A, a photoresist film PT may be formed by providing a photoresist on the fifth insulating layer 50. FIG. 13A shows that the photoresist film PT overlaps the entirety of the base layer BS, but the embodiment is not limited thereto. For another example, the photoresist film PT may not be formed in an area overlapping the first semiconductor pattern SP1'.

Figure 13B:
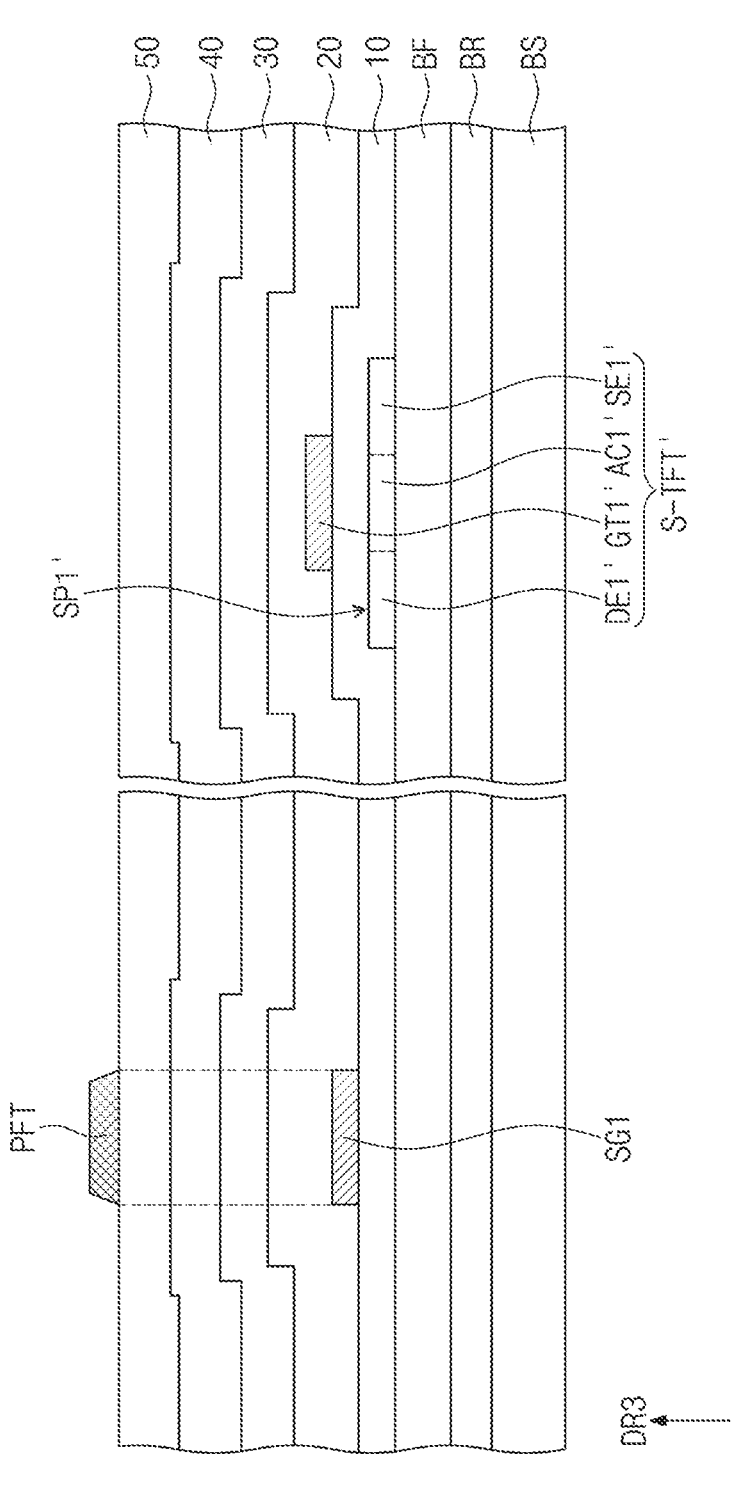
FIG. 13B schematically illustrates manufacturing steps of a display panel according to an embodiment.

The photoresist film PT may be exposed through the mask MSK. The mask MSK may include a first portion R1 that partially transmits and blocks some of the irradiated light, and a second portion R2 that blocks all of the irradiated light. Referring to FIG. 13B, a protective pattern PFT may be formed by exposing the photoresist film PT to the irradiated light. A protective pattern PFT may be formed in an area of the fifth insulating layer 50 overlapping the first signal line SG1. In the description of FIGS. 13A and 13B, a case in which a positive photoresist is used to remove a photoresist film from an exposed portion has been described as an example, but the embodiment is not limited thereto. In one embodiment, a negative photoresist may be used through which the photoresist film of unexposed areas is removed.

Figure 13C:
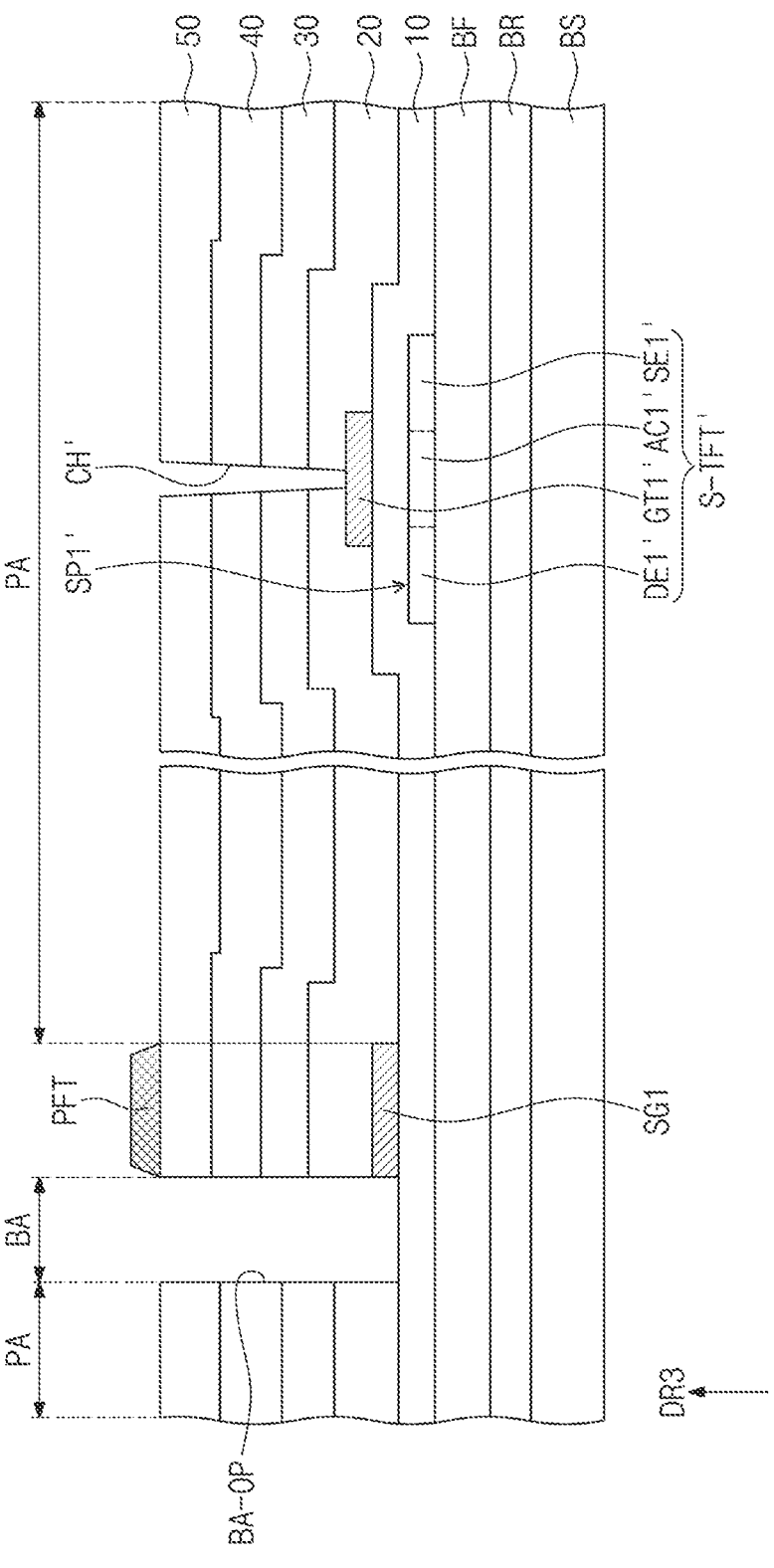
FIG. 13C schematically illustrates manufacturing steps of a display panel according to an embodiment.

Referring to FIG. 13C, an opening BA-OP may correspond to a boundary area BA. The opening BA-OP may be formed not to overlap with the protective pattern PFT. That is, the opening BA-OP may be formed in an area that does not overlap with the first signal line SG1.

The opening BA-OP may be formed by a dry etching process. In the forming of the opening BA-OP, a contact hole CH' contacting the gate GT1' of the silicon transistor S-TFT' may be formed. The opening BA-OP and the contact hole CH' may be formed in the same operation. A gate GT1' of the silicon transistor S-TFT' and a corresponding light emitting element LD (see FIG. 6) and/or signal line may be electrically connected through the contact hole CH'. The signal line may be any one of a plurality of signal lines described with reference to FIG. 6. The contact hole CH' may pass through the third to fifth insulating layers 30, 40, and 50 disposed over the silicon transistor S-TFT'. In addition, the contact hole CH' may pass through the second insulating layer 20 covering the gate GT1' of the silicon transistor S-TFT'.

Although not shown, after forming a contact hole CH' contacting the gate GT1' of the silicon transistor S-TFT', a contact hole may contact the gate GT2 (see FIGS. 8A and 8B) of the oxide transistor O-TFT (see FIGS. 8A and 8B). In this case, an opening BA-OP may be formed in the forming of the contact hole contacting the gate GT2 (see FIGS. 8A and 8B) of the oxide transistor O-TFT (see FIGS. 8A and 8B).

In the fifth insulating layer 50, as the protective pattern PFT is formed in one area overlapping the first signal line SG1, it is possible to prevent the area overlapping the first signal line SG1 from being etched by the etching process. Accordingly, damage to the first signal line SG1 may be effectively prevented. A protective pattern PFT formed from a photoresist film PT (see FIG. 13A) may be removed.

Figure 13D:
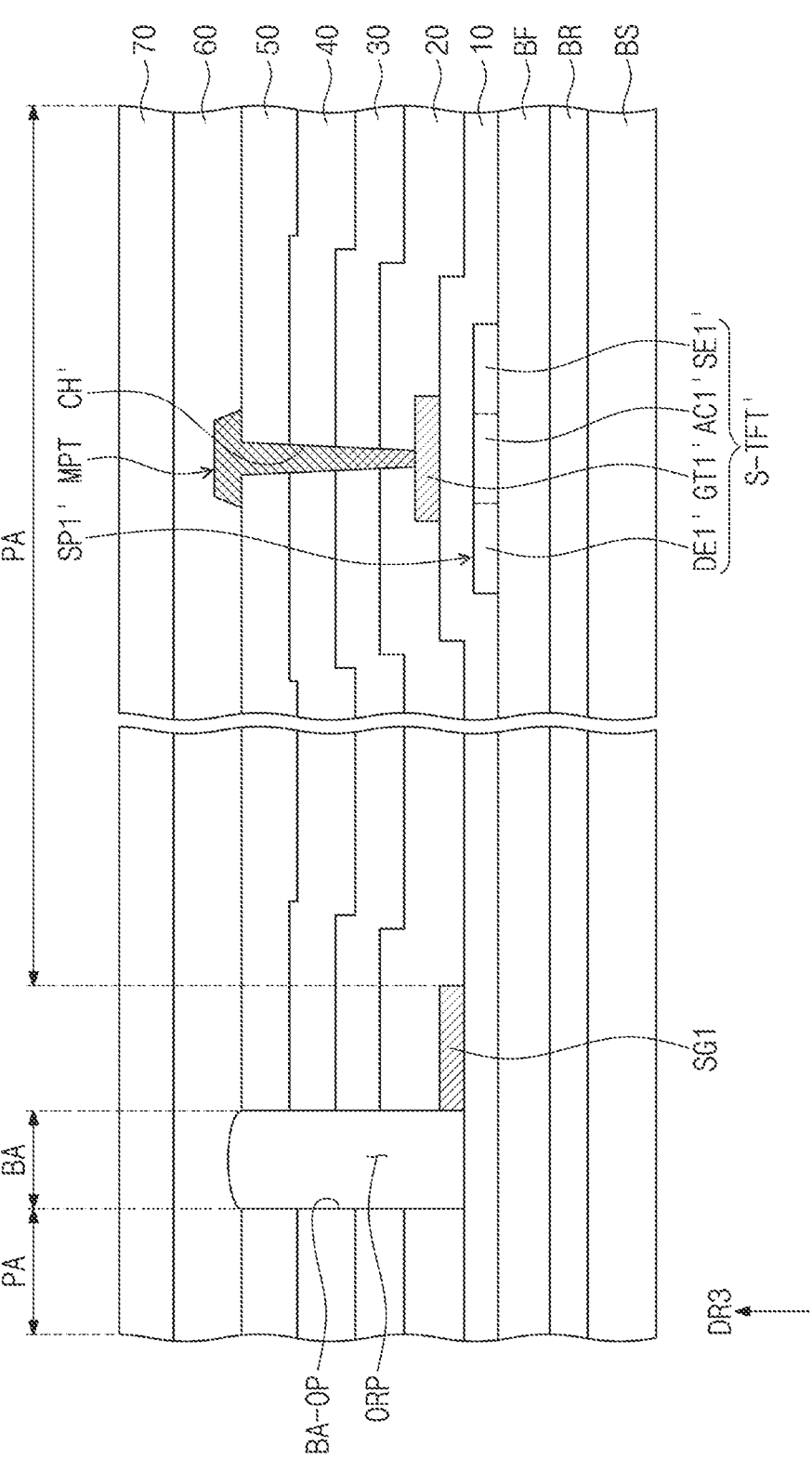
FIG. 13D schematically illustrates manufacturing steps of a display panel according to an embodiment.

Referring to FIG. 13D, a metal pattern MPT may be formed in the contact hole CH'. Subsequently, an organic layer ORP may be filled in the opening BA-OP. Forming the organic layer ORP may be performed simultaneously with forming the first organic insulating layer 60. However, the embodiment is not limited thereto, and forming the first organic insulating layer 60 may be performed after the forming of the organic layer ORP in another embodiment.

Figure 14A:
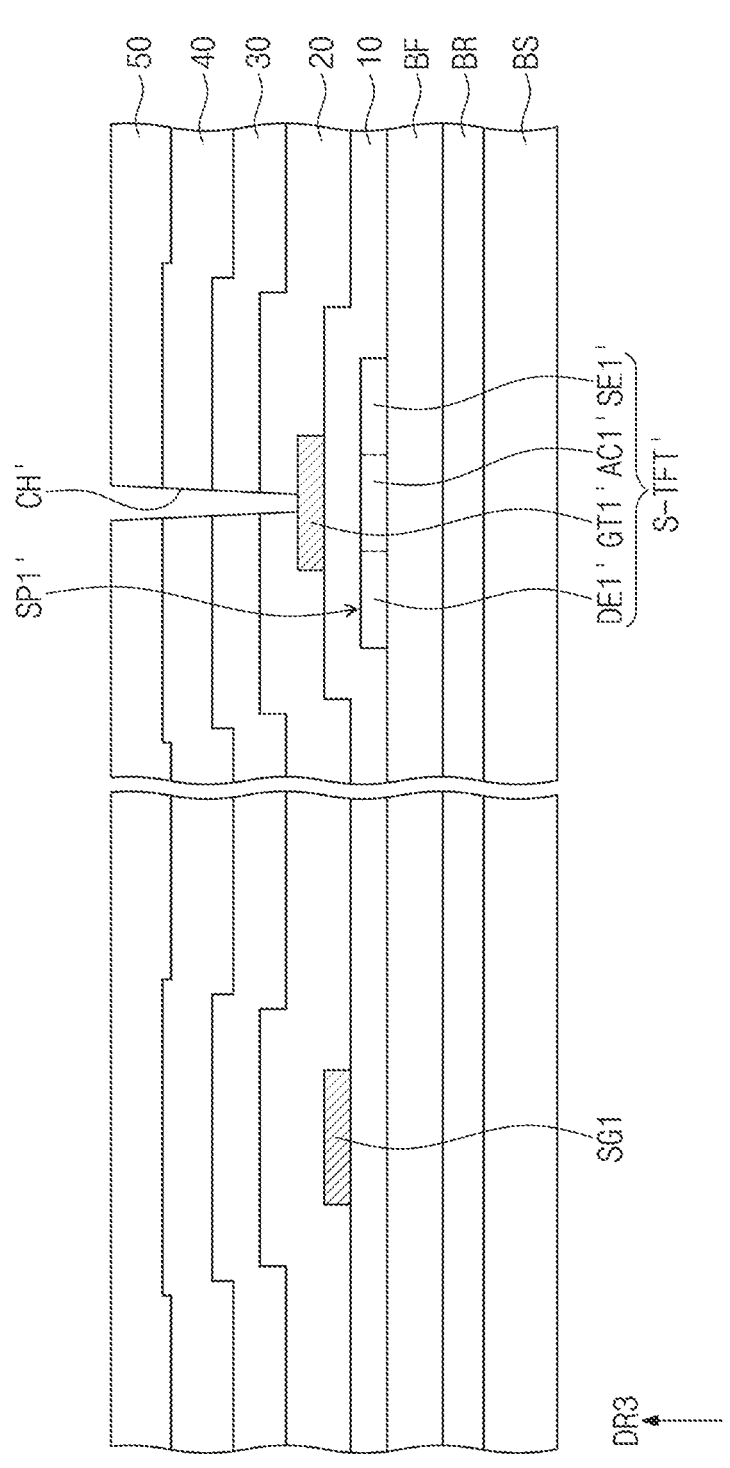
FIG. 14A schematically illustrates manufacturing steps of a display panel according to an embodiment.
Figure 14B:
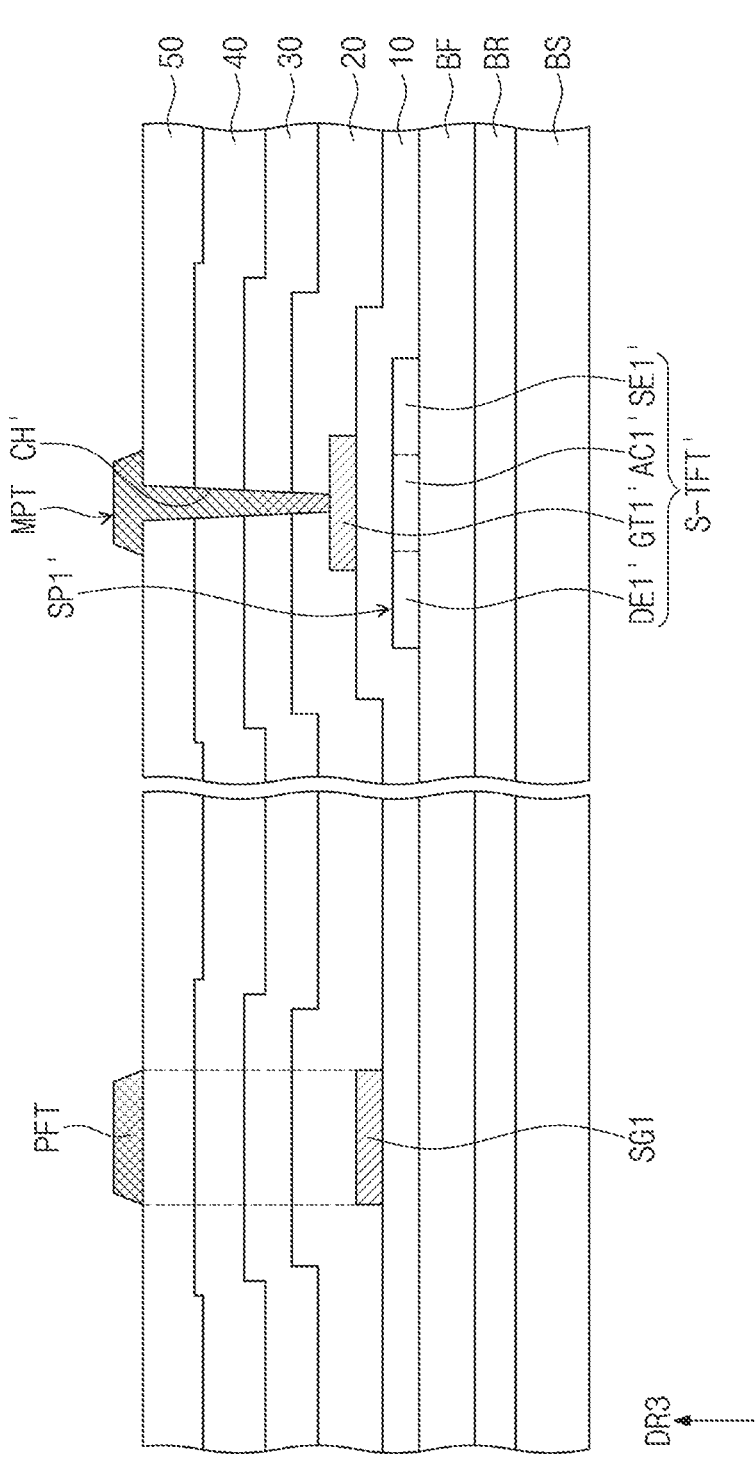
FIG. 14B schematically illustrates manufacturing steps of a display panel according to an embodiment.
Figure 14C:
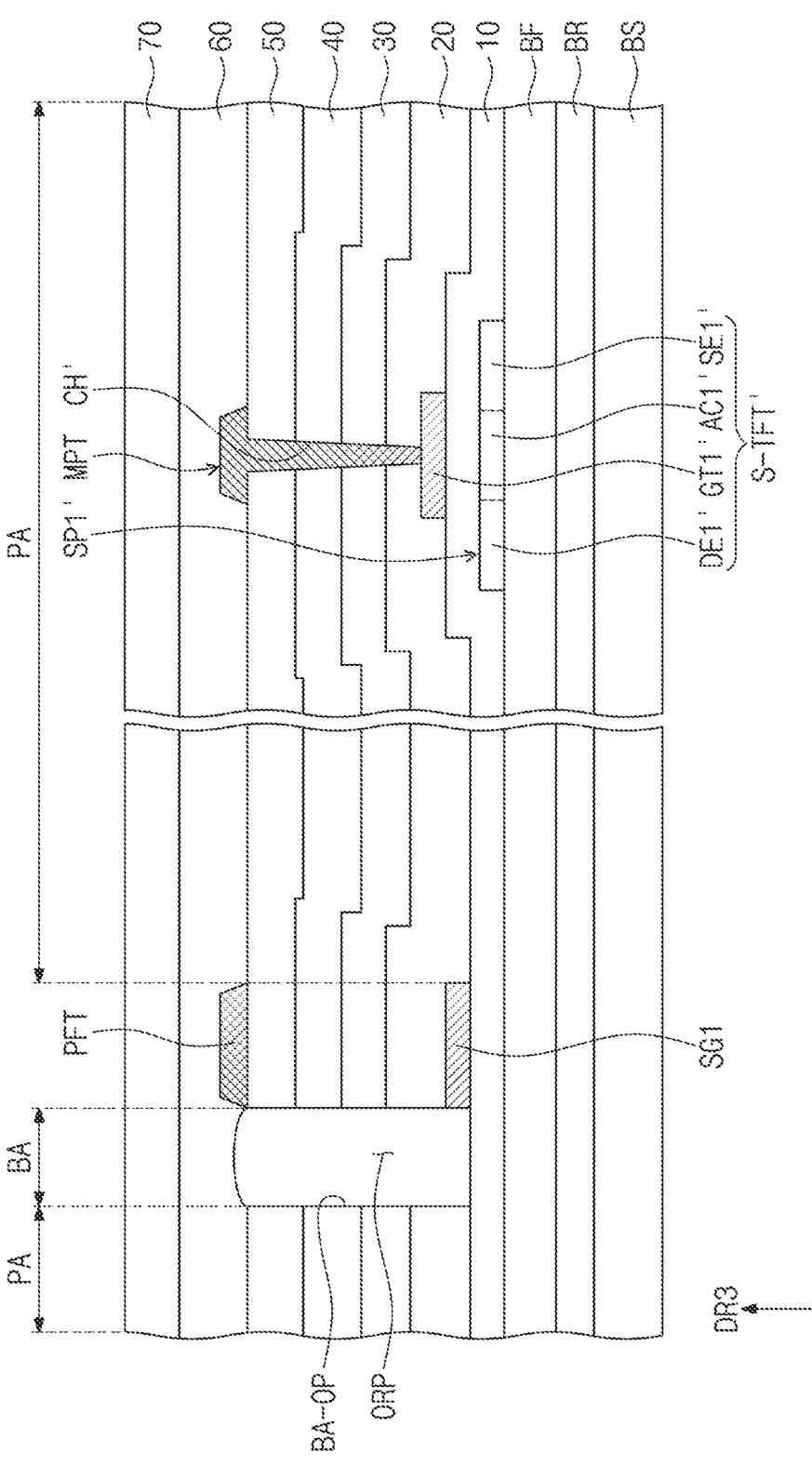
FIG. 14C schematically illustrates manufacturing steps of a display panel according to an embodiment.

FIGS. 14A to 14C show an embodiment different from that of FIGS. 13A to 13D, and show another embodiment of an operation performed after the forming of the first signal line SG1 of FIG. 12. Hereinafter, in the description of a method of manufacturing a display panel according to an embodiment described with reference to FIGS. 14A to 14C, the content overlapping with the content described with reference to FIGS. 1 to 13D will not be described again, and differences will be mainly described.

Referring to FIG. 14A, after forming the first signal line SG1, a contact hole CH' may be formed. Referring to FIG.

14B, in the forming of the metal pattern MPT in the contact hole CH', a protective pattern PFT may be formed in an area overlapping the first signal line SG1. The protective pattern PFT may include the same metal material as the metal pattern MPT. After that, the protective pattern PFT including the metal material may not be removed. That is, compared to those shown in FIGS. 13A to 13C, FIGS. 14A and 14B differ in the formation operation of the protective pattern PFT and the material included in the protective pattern PFT.

In the fifth insulating layer 50, after the protective pattern PFT is formed in an area overlapping the first signal line SG1, an opening BA-OP may be formed. As the protective pattern PFT is formed in an area overlapping the first signal line SG1, damage to the first signal line SG1 may be effectively prevented.

A method of manufacturing a display panel according to an embodiment may include forming a signal line on the upper side of the base layer, forming an insulating layer covering the signal line, forming a protective pattern in one area of the insulating layer overlapping the signal line, forming an opening penetrating the insulating layer so as not to overlap the protective pattern, and forming an organic layer filling the opening. A method of manufacturing a display panel according to an embodiment may include forming a protective pattern in an area overlapping a signal line to prevent damage to the signal line in the opening forming operation.

The display panel according to an embodiment may be formed by using the display panel manufacturing method according to an embodiment. A display panel according to an embodiment may include a base layer, a pixel circuit, insulating layers, an organic layer, a first signal line, and a light emitting element. The base layer may include a boundary area and a pixel area, and openings corresponding to the boundary area may be defined in the insulating layers. An organic layer may be disposed to fill the opening. The boundary area may include a first boundary part and a second boundary part that do not overlap with the first signal line and are spaced apart with the first signal line therebetween. Accordingly, the display panel according to an embodiment may exhibit excellent reliability.

The display panel of one embodiment may exhibit excellent impact resistance and reliability by including the first boundary part and the second boundary part spaced apart from each other with a signal line therebetween.

A method of manufacturing a display panel according to an embodiment includes forming an opening so as not to overlap an area overlapping a signal line, so that manufacturing efficiency may be improved.

Although the embodiments of the invention have been described, it is understood that the invention should not be limited to these embodiments but various changes and modifications may be made by one ordinary skilled in the art within the spirit and scope of the invention as hereinafter claimed.

What is claimed is:
1. A display panel comprising:
a base layer including a boundary area and a pixel area;
a pixel circuit overlapping the pixel area in a plan view;
a plurality of insulating layers in which an opening corresponding to the boundary area is defined;
an organic layer filling the opening;
a first signal line, which does not overlap with the boundary area and overlaps with the pixel area in the plan view; and
a light emitting element disposed on the insulating layers and electrically connected to the pixel circuit, wherein the boundary area comprises a first boundary part and a second boundary part spaced apart with the first signal line therebetween in the plan view.

2. The display panel of claim 1, wherein the organic layer comprises a first sub organic layer corresponding to the first boundary part and a second sub organic layer corresponding to the second boundary part.

3. The display panel of claim 2, wherein a thickness of the first sub organic layer and a thickness of the second sub organic layer are the same.

4. The display panel of claim 3, wherein in the plan view, the first sub organic layer and the second sub organic layer are spaced apart from each other.

5. The display panel of claim 1, wherein on a plane perpendicular to a thickness direction of the display panel, the first signal line extends in a first direction, and the first boundary part and the second boundary part are spaced apart from each other in a second direction crossing the first direction.

6. The display panel of claim 1, further comprising a barrier layer disposed on the base layer,
wherein an upper surface of the barrier layer is exposed by the opening.

7. The display panel of claim 1, further comprising a protective pattern disposed on the first signal line and not overlapping with the organic layer in the plan view,
wherein the protective pattern comprises a metal material.

8. The display panel of claim 1, wherein the insulating layers comprise a first insulating layer on which the first signal line is disposed and a second insulating layer disposed to cover the first signal line,
wherein the second insulating layer comprises a first insulating part overlapping the first signal line and a second insulating part not overlapping the first signal line in the plan view,
wherein a thickness of the first insulating part is less than a thickness of the second insulating part.

9. The display panel of claim 8, wherein a first opening is defined in the second insulating layer between the first insulating part and the second insulating part,
wherein the first opening constitutes a part of the opening.

10. The display panel of claim 8, wherein the first insulating part and the second insulating part do not overlap with the organic layer in the plan view.

11. The display panel of claim 8, further comprising a second signal line, which does not overlap with the boundary area and overlaps with the pixel area in the plan view and is disposed on the second insulating layer,
wherein the insulating layers further comprise a third insulating layer disposed on the second signal line and a fourth insulating layer disposed on the third insulating layer,
wherein the fourth insulating layer comprises a third insulating part overlapping the first signal line or the second signal line and a fourth insulating part not overlapping the first signal line and the second signal line in the plan view,
wherein a thickness of the third insulating part and a thickness of the fourth insulating part are the same.

12. The display panel of claim 11, wherein the third insulating part and the fourth insulating part do not overlap with the organic layer in the plan view.

13. The display panel of claim 11, wherein a second opening is defined in the fourth insulating layer between the third insulating part and the fourth insulating part,
wherein the second opening constitutes a part of the opening.

14. The display panel of claim 1, wherein the pixel circuit comprises:
a first transistor including a first semiconductor pattern and a first gate; and
a second transistor including a second semiconductor pattern disposed in a different layer from the first semiconductor pattern and a second gate disposed in a different layer from the first gate,
wherein the first signal line is disposed in a same layer as the first gate or the second gate.

15. The display panel of claim 14, wherein the first transistor is a silicon transistor, and the second transistor is an oxide transistor.

16. A method for manufacturing a display panel, the method comprising:
preparing a base layer;
forming a signal line on the base layer;
forming an insulating layer to cover the signal line;
forming a protective pattern in an area overlapping the signal line on the insulating layer;
forming an opening that does not overlap the protective pattern and passes through the insulating layer; and
forming an organic layer filling the opening,
wherein the base layer comprises a boundary area and a pixel area, and the opening is formed to correspond to the boundary area.

17. The method of claim 16, wherein in the forming of the protective pattern, a metal material or photoresist is provided.

18. The method of claim 16, further comprising:
forming a semiconductor pattern on the base layer; and
forming a gate on the semiconductor pattern,
wherein the forming of the semiconductor pattern is performed before the forming of the signal line,
wherein the signal line and the gate are formed in a same operation.

19. The method of claim 17, further comprising:
forming a contact hole in contact with the gate,
wherein the contact hole and the opening are formed in a same operation.

20. The method of claim 19, wherein the contact hole passes through the insulating layer.

* * * * *